(12) United States Patent
Lee et al.

(10) Patent No.: US 11,820,859 B2
(45) Date of Patent: Nov. 21, 2023

(54) INFRARED ABSORBING POLYMER, INFRARED ABSORBING/BLOCKING FILM, PHOTOELECTRIC DEVICE, ORGANIC SENSOR, AND ELECTRONIC DEVICE

(71) Applicant: Samsung Electronics Co., Ltd., Suwon-si (KR)

(72) Inventors: Jae Jun Lee, Suwon-si (KR); Ohkyu Kwon, Seoul (KR); Rae Sung Kim, Hwaseong-si (KR); Hwang Suk Kim, Suwon-si (KR); In Sun Park, Suwon-si (KR); Dong-Seok Leem, Seongnam-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 17/242,724

(22) Filed: Apr. 28, 2021

(65) Prior Publication Data
US 2021/0340312 A1   Nov. 4, 2021

(30) Foreign Application Priority Data
Apr. 29, 2020   (KR) .................. 10-2020-0052349

(51) Int. Cl.
| | | |
|---|---|---|
| C08G 61/12 | (2006.01) | |
| G02B 5/22 | (2006.01) | |
| G02B 5/20 | (2006.01) | |
| H10K 85/20 | (2023.01) | |

(52) U.S. Cl.
CPC .......... *C08G 61/126* (2013.01); *G02B 5/208* (2013.01); *G02B 5/223* (2013.01); *H10K 85/211* (2023.02); *C08G 2261/3223* (2013.01); *C08G 2261/3225* (2013.01); *C08G 2261/3243* (2013.01); *C08G 2261/3246* (2013.01); *C08G 2261/50* (2013.01); *C08G 2261/94* (2013.01)

(58) Field of Classification Search
CPC ........ C08G 2261/91; C08G 2261/3223; C08G 2261/3225; C08G 2261/3243; C08G 2261/3246; C08G 2261/50; C08G 2261/94; H01L 51/0047; Y02E 10/549
See application file for complete search history.

(56) References Cited

U.S. PATENT DOCUMENTS

| | | | |
|---|---|---|---|
| 2011/0284080 A1* | 11/2011 | Gaudiana | C08G 61/123 526/256 |
| 2017/0002024 A1 | 1/2017 | Devadoss et al. | |
| 2018/0371157 A1 | 12/2018 | Mitchell et al. | |

FOREIGN PATENT DOCUMENTS

| | | |
|---|---|---|
| JP | 2009/215349 A | 9/2009 |
| WO | WO-2015/138869 A1 | 9/2015 |
| WO | WO-2017/102058 A1 | 6/2017 |

OTHER PUBLICATIONS

An et al. (Polym. Chem., 2015, 6, 6238-6244).*

(Continued)

*Primary Examiner* — Shane Fang
(74) *Attorney, Agent, or Firm* — Harness, Dickey & Pierce, P.L.C.

(57) ABSTRACT

An infrared absorbing polymer includes a first structural unit represented by Chemical Formula 1 and a second structural unit including at least one of Chemical Formula 2A to Chemical Formula 2. The infrared absorbing polymer may be included in an infrared absorbing/blocking film, a photoelectric device, a sensor, and an electronic device.

19 Claims, 10 Drawing Sheets

(56) References Cited

OTHER PUBLICATIONS

Chen et al. (Macromolecules 2019, 52, 6149-6159).*

Cunbin An et al., 'Investigation of the structure-property relationship of thiadiazoloquinoxaline-based copolymer semiconductors via molecular engineering' *Journal of Materials Chemistry C*, vol. 3, 2015, pp. 3876-3881.

Kohsuke Kawabata et al., 'Very Small Bandgap π☐Conjugated Polymers with Extended Thienoquinoids' *Journal of the American Chemical Society*, vol. 138, 2016, pp. 7725-7732.

Gang Qian et al., 'Synthesis and Application of Thiadiazoloquinoxaline-Containing Chromophores as Dopants for Efficient Near-Infrared Organic Light-Emitting Diodes' *Journal of Physical Chemistry C*, vol. 113, 2009, pp. 1589-1595.

Gang Qian et al., 'Simple and Efficient Near-Infrared Organic Chromophores for Light-Emitting Diodes with Single Electroluminescent Emission above 1000nm' *Advanced Materials*, vol. 21, 2009, pp. 111-116.

Karen Strassel et al., 'Squaraine Dye for a Visibly Transparent All-Organic Optical Upconversion Device with Sensitivity at 1000 nm' *ACS Applied Materials and Interfaces*, vol. 10, 2018, pp. 11063-11069.

Jiefeng Hai et al., 'Naphthodifuran alternating quinoxaline copolymers with a bandgap of 1.2 eV and their photovoltaic characterization' *New J. Chem.*, vol. 38, 2014, pp. 4816-4822.

Arjan P. Zoombelt et al., 'Photovoltaic Performance of an Ultrasmall Band Gap Polymer' *Organic Letters*, vol. 11, No. 4, 2009, pp. 903-906.

Timothy T. Steckler et al., 'Very Low Band Gap Thiadiazoloquinoxaline Donor-Acceptor Polymers as Multi-tool Conjugated Polymers' *Journal of the American Chemical Society*, vol. 136, 2014, pp. 1190-1193.

* cited by examiner

INFRARED ABSORBING POLYMER, INFRARED ABSORBING/BLOCKING FILM, PHOTOELECTRIC DEVICE, ORGANIC SENSOR, AND ELECTRONIC DEVICE

CROSS-REFERENCE TO RELATED APPLICATION

This application claims priority to and the benefit of Korean Patent Application No. 10-2020-0052349 filed in the Korean Intellectual Property Office on Apr. 29, 2020, the entire contents of which are incorporated herein by reference.

BACKGROUND

1. Field

An infrared absorbing polymer, infrared (IR) absorbing/blocking film, a photoelectric device, a sensor, and an electronic device are disclosed.

2. Description of the Related Art

An imaging device is used in a digital camera and a camcorder or the like to take an image and to store the same as an electrical signal, and the imaging device includes a sensor separating the incident light according to a wavelength and converting each component to an electrical signal.

Recently, a photoelectric device used in an infrared region for improving sensitivity of a sensor and a photoelectric device used as a biometric device in a low illumination environment has been studied.

SUMMARY

An embodiment provides an infrared absorbing polymer having improved infrared absorption characteristics.

Another embodiment provides an infrared absorbing/blocking film including the infrared absorbing polymer.

Another embodiment provides a photoelectric device including the infrared absorbing polymer.

Another embodiment provides a sensor including the infrared absorbing polymer or the photoelectric device.

Another embodiment provides an electronic device including the photoelectric device or the sensor.

According to an embodiment, an infrared absorbing polymer includes a first structural unit represented by Chemical Formula 1 and a second structural unit including at least one of Chemical Formula 2A Chemical Formula 2I.

[Chemical Formula 1]

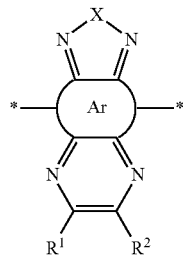

In Chemical Formula 1,

Ar is a substituted or unsubstituted C6 to C30 aromatic ring, a substituted or unsubstituted C3 to C30 heteroaromatic ring, or a combination thereof, X is O, S, Se, Te, S(=O), S(=O$_2$), NR$^a$, CR$^b$R$^c$, SiR$^d$R$^e$, GeR$^f$R$^g$, CR$^h$=CR$^i$, or CR$^{hh}$=CR$^{ii}$, wherein R$^a$, R$^b$, R$^c$, R$^d$, R$^e$, R$^f$, R$^g$, R$^h$, and R$^i$ are independently hydrogen, deuterium, a C1 to C6 alkyl group, a C1 to C6 haloalkyl group, a C6 to C14 aryl group, a C3 to C12 heteroaryl group, a halogen, a cyano group, or a combination thereof, and R$^{hh}$ and R$^{ii}$ are linked to each other to form an aromatic ring, and R$^1$ and R$^2$ are a substituted or unsubstituted C6 to C30 aryl group or a substituted or unsubstituted C3 to C30 heteroaryl group, or R$^1$ and R$^2$ are linked to each other to form a substituted or unsubstituted C6 to C30 arene group and a substituted or unsubstituted C3 to C30 heteroarene group,

[Chemical Formulas 2A to 2I]

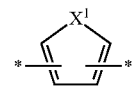
(2A)

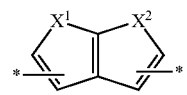
(2B)

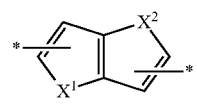
(2C)

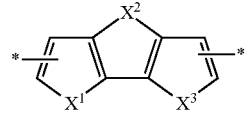
(2D)

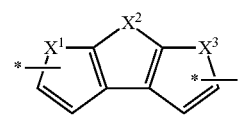
(2E)

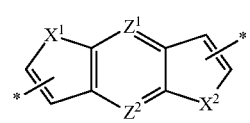
(2F)

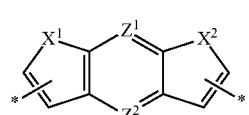
(2G)

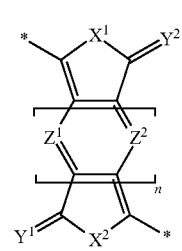
(2H)

-continued (2I)

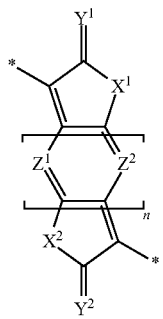

wherein, in Chemical Formula 2A, $X^1$ is Se, Te, S(=O), S(=O)$_2$, NR$^a$, SiR$^d$R$^e$, or GeR$^f$R$^g$, wherein R$^a$, R$^b$, R$^c$, R$^d$, R$^e$, R$^f$, R$^g$, R$^h$, and R$^i$ are independently hydrogen, deuterium, a C1 to C20 alkyl group, a C1 to C20 haloalkyl group, a C6 to C20 aryl group, a C3 to C20 heteroaryl group, a halogen, a cyano group, or a combination thereof, in Chemical Formulas 2B to 2I, $X^1$ to $X^3$ are independently S, Se, Te, S(=O), S(=O)$_2$, NR$^a$, SiR$^d$R$^e$, or GeR$^f$R$^g$, wherein R$^a$, R$^b$, R$^c$, R$^d$, R$^e$, R$^f$, R$^g$, R$^h$, and R$^i$ are independently hydrogen, deuterium, a C1 to C20 alkyl group, a C1 to C20 haloalkyl group, a C6 to C20 aryl group, a C3 to C20 heteroaryl group, a halogen, a cyano group, or a combination thereof, $Z^1$ and $Z^2$ are independently N or CR$^x$, wherein R$^x$ is hydrogen, deuterium, a C1 to C10 alkyl group, a C1 to C10 haloalkyl group, a —SiH$_3$ group, a C1 to C10 alkylsilyl group, a —NH$_2$ group, a C1 to C10 alkylamine group, a C6 to C12 aryl group, a C3 to C12 heteroaryl group, a halogen, a cyano group, or a combination thereof, $Y^1$ and $Y^2$ are independently O, S, Se, or Te, n is 0 or 1, and at least one hydrogen of each aromatic ring may be replaced by deuterium, a halogen, a cyano group, a C1 to C30 alkyl group, a C1 to C30 alkoxy group, a C1 to C30 haloalkyl group, a C6 to C30 aryl group, a C6 to C30 aryloxy group, a —SiH$_3$ group, or a C1 to C30 alkylsilyl group.

In some embodiments, in Chemical Formula 1, Ar may be benzene, a substituted or unsubstituted naphthalene, a substituted or unsubstituted anthracene, a substituted or unsubstituted phenanthrene, a substituted or unsubstituted tetracene, a substituted or unsubstituted pyrene, a substituted or unsubstituted quinoline, a substituted or unsubstituted isoquinoline, a substituted or unsubstituted quinoxaline, a substituted or unsubstituted quinazoline, or a substituted or unsubstituted phenanthroline.

In some embodiments, in Chemical Formula 1, Ar may be one of the moieties represented by Chemical Formula A-1.

[Chemical Formula A-1]

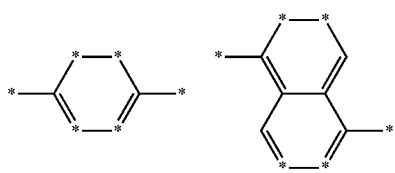

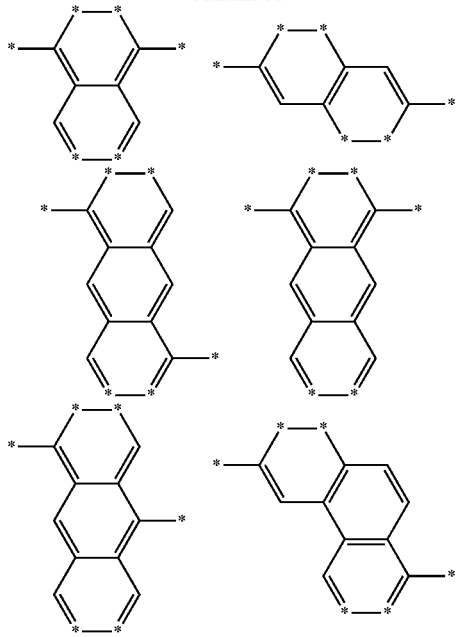

In Chemical Formula A-1, hydrogen of each aromatic ring may be replaced by deuterium, a halogen, a cyano group, a C1 to C10 alkyl group, a C1 to C10 haloalkyl group, a —SiH$_3$ group, or a C1 to C10 alkylsilyl group, and

* inside the aromatic ring is a portion that is bound to the N—X—N-containing ring and the pyrazine ring of Chemical Formula 1.

In some embodiments, in Chemical Formula 1, Ar may be one of the moieties represented by Chemical Formula A-2.

[Chemical Formula A-2]

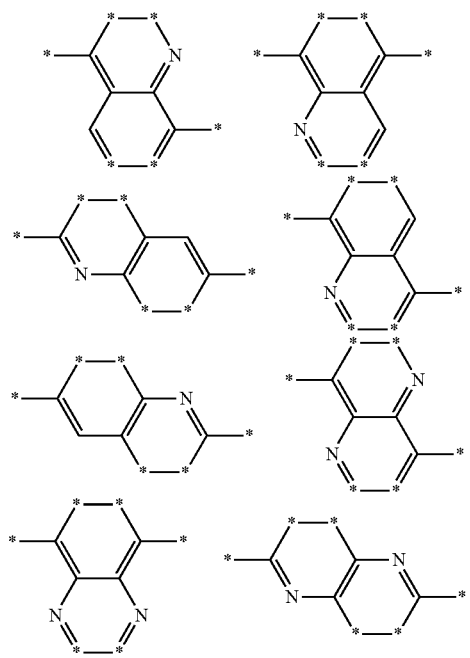

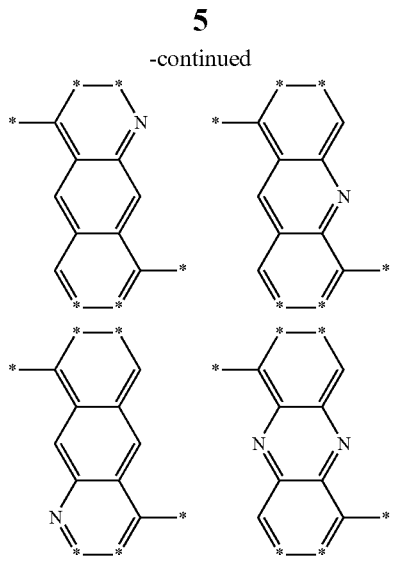

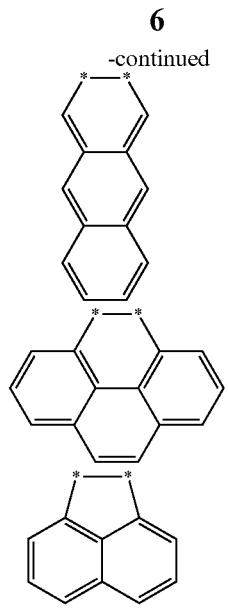

In Chemical Formula A-2, at least one hydrogen of each aromatic ring may be replaced by deuterium, a halogen, a cyano group, a C1 to C10 alkyl group, a C1 to C10 haloalkyl group, a —SiH$_3$ group, or a C1 to C10 alkylsilyl group, and

* inside the aromatic ring is a portion that is bound to the N—X—N-containing ring and the pyrazine ring of Chemical Formula 1.

In some embodiments, in Chemical Formula 1, the substituted or unsubstituted C6 to C30 arene group and a substituted or unsubstituted C3 to C30 heteroarene group formed by linking R$^1$ and R$^2$ to each other may be a substituted or unsubstituted benzene, a substituted or unsubstituted naphthalene, a substituted or unsubstituted acenaphthene, a substituted or unsubstituted anthracene, a substituted or unsubstituted phenanthrene, a substituted or unsubstituted tetracene or a substituted or unsubstituted pyrene; or a substituted or unsubstituted quinoline, a substituted or unsubstituted isoquinoline, a substituted or unsubstituted quinoxaline, a substituted or unsubstituted quinazoline, a substituted or unsubstituted phenanthroline, a substituted or unsubstituted pyrimidine, or a substituted or unsubstituted benzodithiophene.

In some embodiments, in Chemical Formula 1, the substituted or unsubstituted C6 to C30 arene group and a substituted or unsubstituted C3 to C30 heteroarene group formed by linking R$^1$ and R$^2$ to each other may be one of moieties represented by Chemical Formula B-1 and Chemical Formula B-2.

[Chemical Formula B-1]

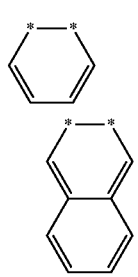

In Chemical Formula B-1, at least one hydrogen of each aromatic ring may be replaced by a halogen, a cyano group, a C1 to C30 alkyl group, a C1 to C30 alkoxy group, a C1 to C30 haloalkyl group, a —SiH$_3$ group, a C1 to C30 alkylsilyl group, a C6 to C30 aryl group, a C6 to C30 aryloxy group, or a C3 to C30 heteroaryl group, and

* inside the aromatic ring is a portion that is bound to the pyrazine ring of Chemical Formula 1.

[Chemical Formula B-2]

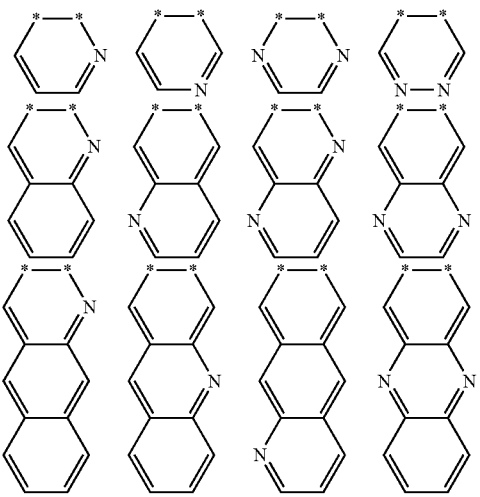

In some embodiments, in Chemical Formula B-2, at least one hydrogen of each aromatic ring may be replaced by a halogen, a cyano group, a C1 to C30 alkyl group, a C1 to C30 alkoxy group, a C1 to C30 haloalkyl group, a —SiH$_3$ group, a C1 to C30 alkylsilyl group, a C6 to C30 aryl group, a C6 to C30 aryloxy group, or a C3 to C30 heteroaryl group, and

* inside the aromatic ring is a portion that is bound to the pyrazine ring of Chemical Formula 1.

In some embodiments, in Chemical Formula 1, the substituted or unsubstituted C6 to C30 arene group and a substituted or unsubstituted C3 to C30 heteroarene group formed by linking R¹ and R² to each other may be one of moieties represented by Chemical Formula B-3-1 or Chemical Formula B-3-2.

[Chemical Formula B-3-1]

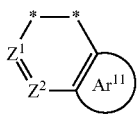

[Chemical Formula B-3-2]

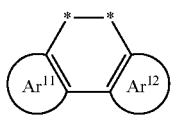

In Chemical Formulas B-3-1 and B-3-2, $Ar^{11}$ and $Ar^{12}$ are independently a substituted or unsubstituted C6 to C30 arene group or a substituted or unsubstituted C3 to C30 heteroarene group, in Chemical Formula B-3-1, $Z^1$ and $Z^2$ are independently N or $CR^x$, wherein $R^x$ is hydrogen, deuterium, a C1 to C10 alkyl group, a C1 to C10 haloalkyl group, a —SiH₃ group, a C1 to C10 alkylsilyl group, a —NH₂ group, a C1 to C10 alkylamine group, a C6 to C10 arylamine group, a C6 to C14 aryl group, a C3 to C12 heteroaryl group, a halogen, a cyano group, or a combination thereof, and

* inside the aromatic ring is a portion that is bound to the pyrazine ring of Chemical Formula 1.

In some embodiments, the moiety represented by Chemical Formula B-3-1 may be represented by Chemical Formula B-3-11.

[Chemical Formula B3-11]

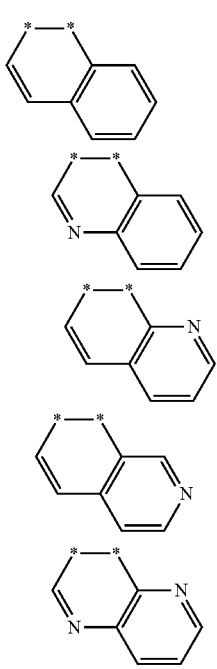

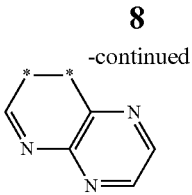

In Chemical Formula B-3-11, at least one hydrogen of each aromatic ring may be replaced by a halogen, a cyano group, a C1 to C30 alkyl group, a C1 to C30 alkoxy group, a C1 to C30 haloalkyl group, a —SiH₃ group, a C1 to C30 alkylsilyl group, a C6 to C30 aryl group, a C6 to C30 aryloxy group, or a C3 to C30 heteroaryl group, and

* inside the aromatic ring is a portion that is bound to the pyrazine ring of Chemical Formula 1.

In some embodiments, the moiety represented by Chemical Formula B-3-2 may be represented by Chemical Formula B-3-21.

[Chemical Formula B-3-21]

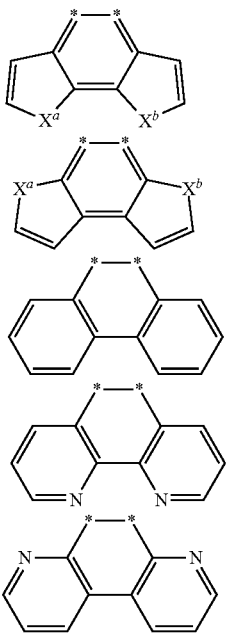

In Chemical Formula B-3-21, at least one hydrogen of each aromatic ring may be replaced by a halogen, a cyano group, a C1 to C30 alkyl group, a C1 to C30 alkoxy group, a C1 to C30 haloalkyl group, a —SiH₃ group, a C1 to C30 alkylsilyl group, a C6 to C30 aryl group, a C6 to C30 aryloxy group, or a C3 to C30 heteroaryl group, $X^a$ and $X^b$ are independently O, S, Se, Te, $NR^a$, $SiR^bR^c$, or $GeR^dR^e$, wherein $R^a$, $R^b$, $R^c$, $R^d$, and $R^e$ are independently hydrogen, a halogen, a substituted or unsubstituted C1 to C10 alkyl group, or a substituted or unsubstituted C6 to C10 aryl group, and

* inside the aromatic ring is a portion that is bound to the pyrazine ring of Chemical Formula 1.

In some embodiments, the infrared absorbing polymer may include about 20 mol % to about 50 mol % of the first structural unit and about 50 mol % to about 80 mol % of the second structural unit.

In some embodiments, the infrared absorbing polymer may further include a third structural unit represented by Chemical Formula 3.

[Chemical Formula 3]

In Chemical Formula 3, m is an integer of 0 to 3, and at least one hydrogen of each aromatic ring may be replaced by deuterium, a halogen, a cyano group, a C1 to C10 alkyl group, a C1 to C10 haloalkyl group, a —$SiH_3$ group, or a C1 to C10 alkylsilyl group.

In some embodiments, the third structural unit may be included in an amount of about 40 parts by mole to about 300 parts by mole based on 100 parts by mole of a sum of the first structural unit and the second structural unit.

In some embodiments, the infrared absorbing polymer may exhibit a peak absorption wavelength in a wavelength range of about 750 nm to about 3000 nm.

According to another embodiment, an infrared absorbing/blocking film including the infrared absorbing polymer is provided.

According to another embodiment, a photoelectric device includes a first electrode and a second electrode facing each other, and a photoactive layer between the first electrode and the second electrode, wherein the photoactive layer includes the infrared absorbing polymer including the first structural unit represented by Chemical Formula 1 and the second structural unit including at least one of Chemical Formulas 2A to 2I.

According to another embodiment, a sensor including the photoelectric device is provided.

According to another embodiment, an electronic device including the photoelectric device or the sensor is provided.

According to another embodiment, a photoactive layer including the infrared absorbing polymer and an n-type semiconductor connected to the infrared absorbing polymer is provided.

The infrared absorbing polymer may exhibit good light absorption characteristics in the infrared region, and thus may be effectively used for photoelectric devices and/or sensors.

DETAILED DESCRIPTION

Figure 1A:
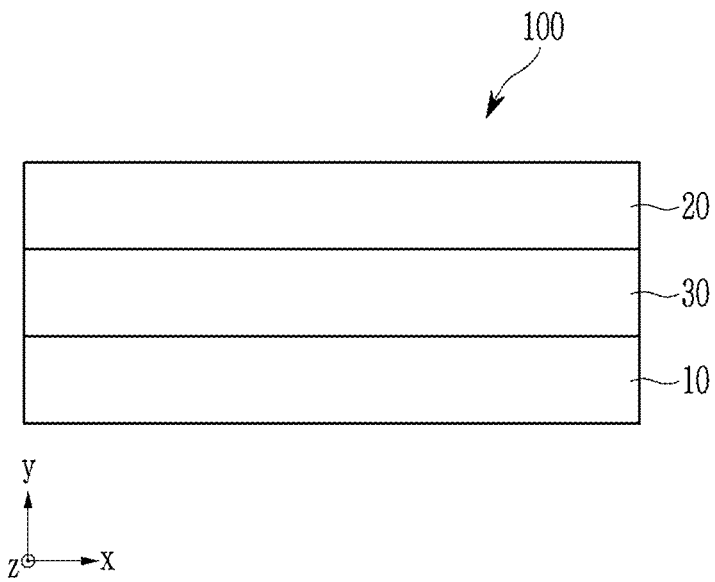
FIGS. 1A and 1B are cross-sectional views showing photoelectric devices according to embodiments.

Hereinafter, embodiments will be described in detail so that those of ordinary skill in the art may easily implement them. However, a structure that is actually applied may be implemented in various different forms and is not limited to the embodiments described herein.

In the drawings, the thickness of layers, films, panels, regions, etc., are exaggerated for clarity.

It will be understood that when an element such as a layer, film, region, or substrate is referred to as being "on" another element, it may be directly on the other element or intervening elements may also be present. In contrast, when an element is referred to as being "directly on" another element, there are no intervening elements present.

Parts having no relationship with the description are omitted for clarity, and the same or similar constituent elements are indicated by the same reference numeral throughout the specification.

Expressions such as "at least one of," when preceding a list of elements (e.g., A, B, and C), modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; A and B; A and C; B and C; and A, B, and C."

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, the term "combination" includes a mixture of two or more, mutual substitution, and a stacked structure of two or more.

As used herein, when specific definition is not otherwise provided, the term "substituted" refers to replacement of hydrogen of a compound or a functional group by a substituent of a halogen, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a silyl group, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroaryl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, or a combination thereof.

As used herein, when specific definition is not otherwise provided, the term "hetero" refers to one including 1 to 4 heteroatoms selected from N, O, S, Se, Te, Si, and P.

As used herein, when a definition is not otherwise provided, the term "aromatic ring" refers to a functional group in which all atoms in the cyclic functional group have a p-orbital, wherein these p-orbitals are conjugated and "heteroaromatic ring" refers to an aromatic ring including a heteroatom. The "aromatic ring" refers to a C6 to C30 arene group, for example a C6 to C20 arene group, or a C6 to C30 aryl group, for example a C6 to C20 aryl group, and the "heteroaromatic ring" refers to a C3 to C30 heteroarene group, for example, a C3 to C20 heteroarene group or a C6 to C30 heteroaryl group, for example, a C6 to C20 heteroaryl group.

As used herein, when a definition is not otherwise provided, "arene group" refers to a hydrocarbon group having an aromatic ring, and includes monocyclic and polycyclic hydrocarbon groups, and the additional ring of the polycyclic hydrocarbon group may be an aromatic ring or a nonaromatic ring. "Heteroarene group" refers to an arene group including 1 to 3 heteroatoms selected from N, O, S, Se, Te, P, and Si in a cyclic group.

As used herein, when a definition is not otherwise provided, "aryl group" refers to a group including at least one hydrocarbon aromatic moiety. All the elements of the hydrocarbon aromatic moiety have p-orbitals which form conjugation, for example a phenyl group, a naphthyl group, and the like; two or more hydrocarbon aromatic moieties may be linked by a sigma bond, for example a biphenyl group, a terphenyl group, a quarterphenyl group, and the like; and two or more hydrocarbon aromatic moieties are fused directly or indirectly to provide a non-aromatic fused ring, for example a fluorenyl group. The aryl group may include a monocyclic, polycyclic or fused ring polycyclic (e.g., rings sharing adjacent pairs of carbon atoms) functional group.

As used herein, when a definition is not otherwise provided, "heteroaryl group" includes at least one heteroatom selected from N, O, S, Se, Te, P, and Si instead of carbon (C) in the ring of the aryl group. When the heteroaryl group is a fused ring, at least one of the ring constituting the heteroaryl group may have a heteroatom, and may have a heteroatom for each ring.

As used herein, when a definition is not otherwise provided, "ring" refers to an aromatic ring, a non-aromatic ring, a hetero aromatic ring, a hetero non-aromatic ring, a fused ring, and/or a combination thereof. The aromatic ring is the same as described above, and the non-aromatic ring may be a C3 to C30 cycloalkyl group, a C3 to C30 cycloalkenyl group, or a C3 to C30 cycloalkynyl group.

As used herein, when a definition is not otherwise provided, "halogen" may be any one of F, Cl, Br and I, and the haloalkyl group is one in which at least one hydrogen of the alkyl group is replaced by a halogen, and may be, for example, a perfluoroalkyl group such as —$CF_3$.

As used herein, when a definition is not otherwise provided, "alkyl group" refers to a linear or branched alkyl group, and may be a C1 to C30 alkyl group, for example, a C1 to C20 alkyl group or a C1 to C10 alkyl group.

As used herein, when a definition is not otherwise provided, the "infrared wavelength region" includes a near-infrared/infrared wavelength region in a wavelength region of about 750 nm to about 3000 nm.

Hereinafter, an infrared absorbing polymer according to an embodiment is described. The infrared absorbing polymer includes a first structural unit represented by Chemical Formula 1 and a second structural unit including at least one of Chemical Formula 2A to Chemical Formula 2I.

[Chemical Formula 1]

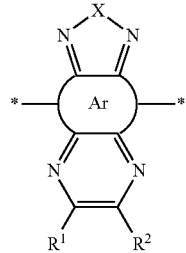

In Chemical Formula 1,

Ar is a substituted or unsubstituted C6 to C30 aromatic ring, a substituted or unsubstituted C3 to C30 heteroaromatic ring, or a combination thereof, X is O, S, Se, Te, S(=O), S(=$O_2$), $NR^a$, $CR^bR^c$, $SiR^dR^e$, $GeR^fR^g$, $CR^h$=$CR^i$, or $CR^{hh}$=$CR^{ii}$, wherein $R^a$, $R^b$, $R^c$, $R^d$, $R^e$, $R^f$, $R^g$, $R^h$, and $R^i$ are independently hydrogen, deuterium, a C1 to C6 alkyl group, a C1 to C6 haloalkyl group, a C6 to C14 aryl group, a C3 to C12 heteroaryl group, a halogen, a cyano group, or a combination thereof, and $R^{hh}$ and $R^{ii}$ are linked to each other to form an aromatic ring, and $R^1$ and $R^2$ are a substituted or unsubstituted C6 to C30 aryl group or a substituted or unsubstituted C3 to C30 heteroaryl group, or $R^1$ and $R^2$ are linked to each other to form a substituted or unsubstituted C6 to C30 arene group and a substituted or unsubstituted C3 to C30 heteroarene group,

[Chemical Formulas 2A to 2I]

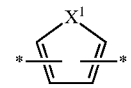

(2A)

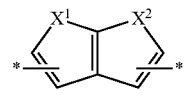

(2B)

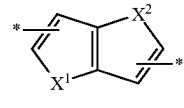

(2C)

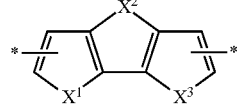

(2D)

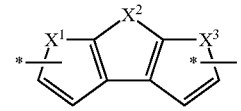

(2E)

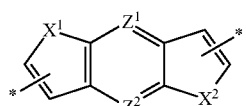

(2F)

-continued

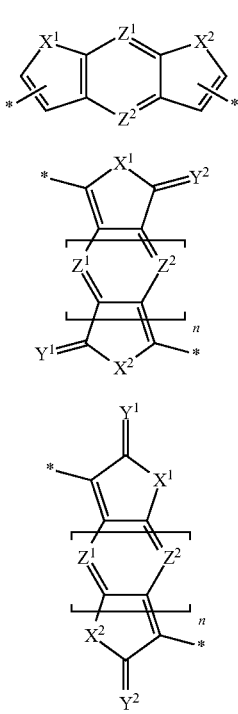

(2G)

(2H)

(2I)

wherein, in Chemical Formula 2A, $X^1$ is Se, Te, S(=O), S(=O)$_2$, NR$^a$, SiR$^d$R$^e$, or GeR$^f$R$^g$, wherein R$^a$, R$^b$, R$^c$, R$^d$, R$^e$, R$^f$, R$^g$, R$^h$, and R$^i$ are independently hydrogen, deuterium, a C1 to C20 alkyl group, a C1 to C20 haloalkyl group, a C6 to C20 aryl group, a C3 to C20 heteroaryl group, a halogen, a cyano group, or a combination thereof, in Chemical Formulas 2B to 2I, $X^1$ to $X^3$ are independently S, Se, Te, S(=O), S(=O)$_2$, NR$^a$, SiR$^d$R$^e$, or GeR$^f$R$^g$, wherein R$^a$, R$^b$, R$^c$, R$^d$, R$^e$, R$^f$, R$^g$, R$^h$, and R$^i$ are independently hydrogen, deuterium, a C1 to C20 alkyl group, a C1 to C20 haloalkyl group, a C6 to C20 aryl group, a C3 to C20 heteroaryl group, a halogen, a cyano group, or a combination thereof, $Z^1$ and $Z^2$ are independently N or CR$^x$, wherein R$^x$ is hydrogen, deuterium, a C1 to C10 alkyl group, a C1 to C10 haloalkyl group, a —SiH$_3$ group, a C1 to C10 alkylsilyl group, a —NH$_2$ group, a C1 to C10 alkylamine group, a C6 to C12 aryl group, a C3 to C12 heteroaryl group, a halogen, a cyano group, or a combination thereof, $Y^1$ and $Y^2$ are independently O, S, Se, or Te, n is 0 or 1, and at least one hydrogen of each aromatic ring may be replaced by deuterium, a halogen, a cyano group, a C1 to C10 alkyl group, a C1 to C10 haloalkyl group, a —SiH$_3$ group, or a C1 to C10 alkylsilyl group.

The * in Chemical Formula 1, and Chemical Formula 2A ton Chemical Formula 2I means a moiety linked to another structural unit.

Materials that absorb long-wavelength light such as near-infrared/infrared light need to have a small HOMO-LUMO energy bandgap. The polymer may be designed to have a small energy bandgap since the conjugation length may be easily adjusted. Until now, studies on polymers having a small energy bandgap have been conducted in various ways, but the absorption characteristics in the infrared region are very low, and the device efficiency in the infrared region tends to be hardly obtained.

The polymer according to the embodiment may provide a structure having strong charge transfer characteristics and small energy bandgap by including the first structural unit represented by Chemical Formula 1 and the second structural unit including at least one of Chemical Formula 2A to Chemical Formula 2I. Therefore, the polymer may effectively absorb light in the near-infrared/infrared wavelength range (e.g., about 750 nm to about 3000 nm). In addition, since a thin film may be formed through a solution process, the manufacturing cost of the device may be reduced.

In Chemical Formula 1, Ar may be benzene, a substituted or unsubstituted naphthalene, a substituted or unsubstituted anthracene, a substituted or unsubstituted phenanthrene, a substituted or unsubstituted tetracene, or a substituted or unsubstituted pyrene. In addition, in Chemical Formula 1, Ar may be a substituted or unsubstituted quinoline, a substituted or unsubstituted isoquinoline, a substituted or unsubstituted quinoxaline, a substituted or unsubstituted quinazoline, or a substituted or unsubstituted phenanthroline.

In Chemical Formula 1, Ar may be one of moieties represented by Chemical Formula A-1.

[Chemical Formula A-1]

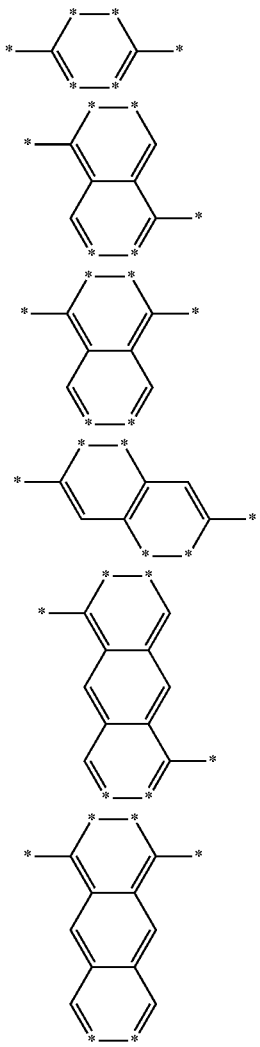

-continued

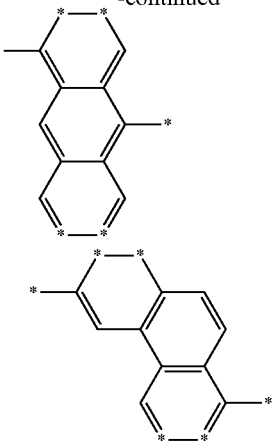

In Chemical Formula A-1,
at least one hydrogen of each aromatic ring may be replaced by deuterium, a halogen, a cyano group, a C1 to C10 alkyl group, a C1 to C10 haloalkyl group, a —SiH$_3$ group, or a C1 to C10 alkylsilyl group, and

* inside the aromatic ring is a portion that is bound to the N—X—N-containing ring and the pyrazine ring of Chemical Formula 1.

In Chemical Formula 1, Ar may be one of moieties represented by Chemical Formula A-2.

[Chemical Formula A-2]

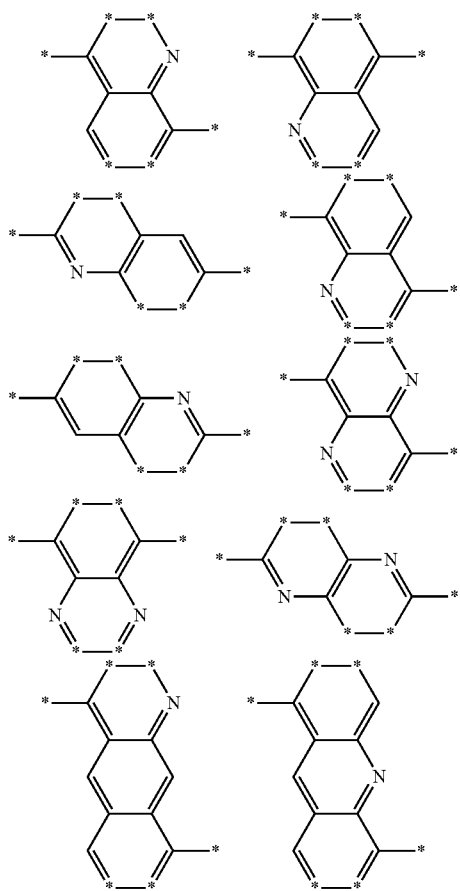

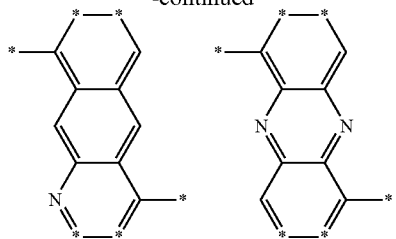

In Chemical Formula A-2,
at least one hydrogen of each aromatic ring may be replaced by deuterium, a halogen, a cyano group, a C1 to C10 alkyl group, a C1 to C10 haloalkyl group, a —SiH$_3$ group, or a C1 to C10 alkylsilyl group, and

* inside the aromatic ring is a portion that is bound to the N—X—N-containing ring and the pyrazine ring of Chemical Formula 1.

In Chemical Formula 1, $R^1$ and $R^2$ may be a substituted or unsubstituted C6 to C30 aryl group or a substituted or unsubstituted C3 to C30 heteroaryl group, or $R^1$ and $R^2$ may be linked to each other to form a substituted or unsubstituted C6 to C30 arene group and a substituted or unsubstituted C3 to C30 heteroarene group.

When $R^1$ and $R^2$ in Chemical Formula 1 are a substituted or unsubstituted C6 to C30 aryl group or a substituted or unsubstituted C3 to C30 heteroaryl group, Chemical Formula 1 may be represented by Chemical Formula 1A.

[Chemidal Formula 1A]

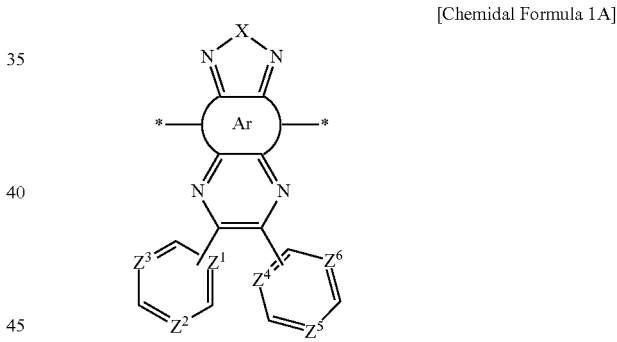

In Chemical Formula 1A,
Ar and X are the same as in Chemical Formula 1,
$Z^1$ to $Z^6$ are independently N or CR$^x$, wherein R$^x$ is hydrogen, deuterium, a C1 to C20 alkyl group, a C1 to C20 haloalkyl group, a —SiH$_3$ group, a C1 to C20 alkylsilyl group, a —NH$_2$ group, a C1 to C20 alkylamine group, a C6 to C12 aryl group, a C3 to C12 heteroaryl group, a halogen, a cyano group, or a combination thereof, and at least one hydrogen of each aromatic ring may be replaced by deuterium, a halogen, a cyano group, a C1 to C30 alkyl group, a C1 to C30 alkoxy group, a C1 to C30 haloalkyl group, a C6 to C30 aryl group, a C6 to C30 aryloxy group, a —SiH$_3$ group, or a C1 to C30 alkylsilyl group.

When $R^1$ and $R^2$ in Chemical Formula 1 are a substituted or unsubstituted C6 to C30 aryl group or a substituted or unsubstituted C3 to C30 heteroaryl group, the C6 to C30 aryl group or C3 to C30 heteroaryl group may be substituted with a C1 to C30 alkoxy group or a C6 to C30 aryloxy group. In this case, the solubility of the polymer in the solvent may be improved.

The substituted or unsubstituted C6 to C30 arene group and the substituted or unsubstituted C3 to C30 heteroarene group formed by linking R1 and R2 to each other may shift the absorption wavelength of the polymer to a long wavelength and increase the stability of the polymer.

The substituted or unsubstituted C6 to C30 arene group and a substituted or unsubstituted C3 to C30 heteroarene group formed by linking $R^1$ and $R^2$ to each other may be a substituted or unsubstituted benzene, a substituted or unsubstituted naphthalene, a substituted or unsubstituted acenaphthene, a substituted or unsubstituted anthracene, a substituted or unsubstituted phenanthrene, a substituted or unsubstituted tetracene or a substituted or unsubstituted pyrene; and a substituted or unsubstituted quinoline, a substituted or unsubstituted isoquinoline, a substituted or unsubstituted quinoxaline, a substituted or unsubstituted quinazoline, a substituted or unsubstituted phenanthroline, a substituted or unsubstituted pyrimidine, or a substituted or unsubstituted benzodithiophene.

The substituted or unsubstituted C6 to C30 arene group and a substituted or unsubstituted C3 to C30 heteroarene group formed by linking $R^1$ and $R^2$ to each other may be one of the moieties represented by Chemical Formula B-1 and Chemical Formula B-2.

[Chemical Formula B-1]

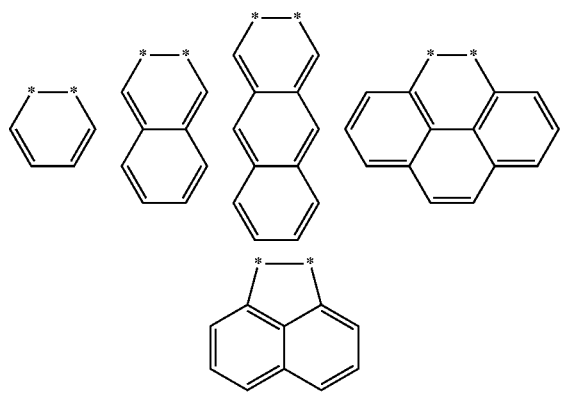

In Chemical Formula B-1, at least one hydrogen of each aromatic ring may be replaced by a halogen, a cyano group, a C1 to C30 alkyl group, a C1 to C30 alkoxy group, a C1 to C30 haloalkyl group, a —SiH$_3$ group, a C1 to C30 alkylsilyl group, a C6 to C30 aryl group, a C6 to C30 aryloxy group, or a C3 to C30 heteroaryl group, and

* inside the aromatic ring is a portion that is bound to the pyrazine ring of Chemical Formula 1.

[Chemical Formula B-2]

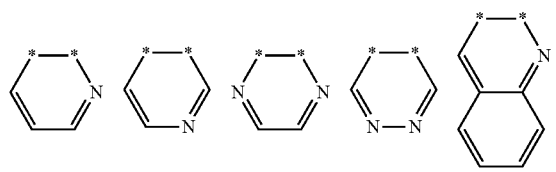

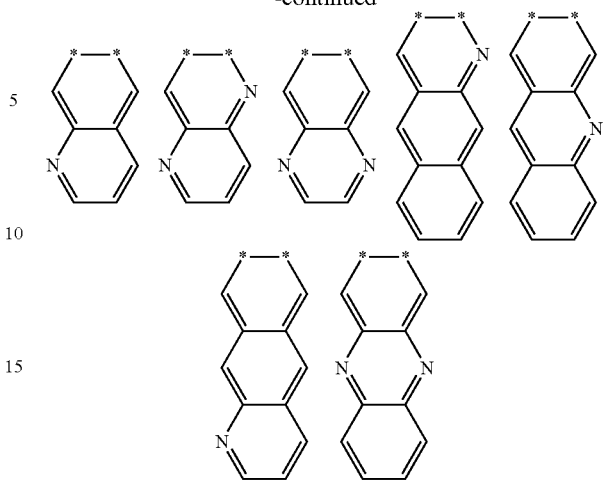

In Chemical Formula B-2, at least one hydrogen of each aromatic ring may be replaced by a halogen, a cyano group, a C1 to C30 alkyl group, a C1 to C30 alkoxy group, a C1 to C30 haloalkyl group, a —SiH$_3$ group, a C1 to C30 alkylsilyl group, a C6 to C30 aryl group, a C6 to C30 aryloxy group, or a C3 to C30 heteroaryl group, and

* inside the aromatic ring is a portion that is bound to the pyrazine ring of Chemical Formula 1.

The substituted or unsubstituted C6 to C30 arene group and a substituted or unsubstituted C3 to C30 heteroarene group formed by linking $R^1$ and $R^2$ to each other may be one of moieties represented by Chemical Formula B-3-1 or Chemical Formula B-3-2.

[Chemical Formula B3-1]

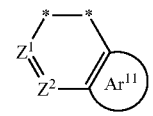

[Chemical Formula B-3-2]

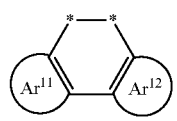

In Chemical Formulas B-3-1 and B-3-2, $Ar^{11}$ and $Ar^{12}$ are independently a substituted or unsubstituted C6 to C30 arene group or a substituted or unsubstituted C3 to C30 heteroarene group, in Chemical Formula B-3-1, $Z^1$ and $Z^2$ are independently $CR^a$ or N, wherein $R^a$ is hydrogen, deuterium, a C1 to C10 alkyl group, a C1 to C10 haloalkyl group, a —SiH$_3$ group, a C1 to C10 alkylsilyl group, a —NH$_2$ group, a C1 to C10 alkylamine group, a C6 to C10 arylamine group, a C6 to C14 aryl group, a C3 to C12 heteroaryl group, a halogen, a cyano group, or a combination thereof, and

* inside the aromatic ring is a portion that is bound to the pyrazine ring of Chemical Formula 1.

The moiety represented by Chemical Formula B-3-1 may be represented by Chemical Formula B-3-11.

[Chemical Formula B-3-11]

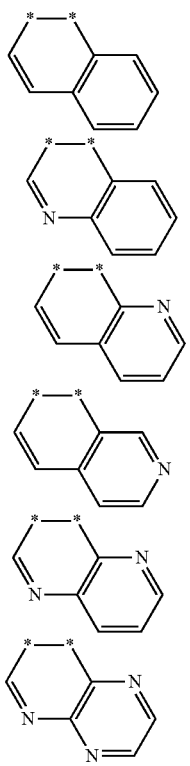

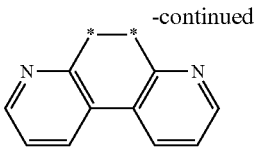

In Chemical Formula B-3-11, at least one hydrogen of each aromatic ring may be replaced by a halogen, a cyano group, a C1 to C30 alkyl group, a C1 to C30 alkoxy group, a C1 to C30 haloalkyl group, a —SiH$_3$ group, a C1 to C30 alkylsilyl group, a C6 to C30 aryl group, a C6 to C30 aryloxy group, or a C3 to C30 heteroaryl group, and

* inside the aromatic ring is a portion that is bound to the pyrazine ring of Chemical Formula 1.

The moiety represented by Chemical Formula B-3-2 may be represented by Chemical Formula B-3-21.

[Chemical Formula B-3-21]

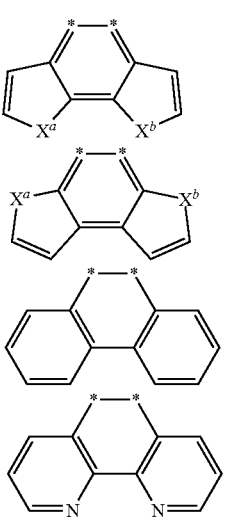

In Chemical Formula B-3-21, at least one hydrogen of each aromatic ring may be replaced by a halogen, a cyano group, a C1 to C30 alkyl group, a C1 to C30 alkoxy group, a C1 to C30 haloalkyl group, a —SiH$_3$ group, a C1 to C30 alkylsilyl group, a C6 to C30 aryl group, a C6 to C30 aryloxy group, or a C3 to C30 heteroaryl group, $X^a$ and $X^b$ are independently O, S, Se, Te, $NR^a$, $SiR^bR^c$, or $GeR^dR^e$, wherein $R^a$, $R^b$, $R^c$, $R^d$, and $R^e$ are independently hydrogen, a halogen, a substituted or unsubstituted C1 to C10 alkyl group, or a substituted or unsubstituted C6 to C10 aryl group, and

* inside the aromatic ring is a portion that is bound to the pyrazine ring of Chemical Formula 1.

The substituted or unsubstituted C6 to C30 arene group and a substituted or unsubstituted C3 to C30 heteroarene group formed by linking $R^1$ and $R^2$ to each other may increase a conjugation length and increase the planarization of the polymer structure, thereby reducing an energy bandgap of the polymer. Thereby, the absorption of the long wavelength region of the polymer may be increased.

In Chemical Formulas B-1, B-2, B-3-1, B-3-2, B-3-11, or B-3-21, when at least one hydrogen of the aromatic ring is replaced by a C1 to C30 alkoxy group or a C6 to C30 aryloxy group, a solubility of the polymer may be improved.

The polymer including the first structural unit includes a second structural unit selected from Chemical Formulas 2A to 2I. The second structural unit increases a planarity of the polymer and shifts the absorption wavelength of the polymer to a long wavelength, thereby exhibiting excellent light absorption characteristics in the infrared region (e.g., absorption coefficient in the infrared region). The first structural unit may serve as an acceptor, and Chemical Formulas 2A to 2I may serve as a donor to improve charge transfer characteristics.

In Chemical Formulas 2A to 2I, when at least one hydrogen of an aromatic ring is replaced by a C1 to C30 alkoxy group or a C6 to C30 aryloxy group, a solubility of the polymer may be improved.

The first structural unit may be included in an amount of greater than or equal to about 20 mol %, greater than or equal to about 21 mol %, greater than or equal to about 22 mol %, greater than or equal to about 23 mol %, greater than or equal to about 24 mol %, or greater than or equal to about 25 mol % and less than or equal to about 50 mol %, less than or equal to about 49 mol %, less than or equal to about 48 mol %, less than or equal to about 47 mol %, less than or equal to about 46 mol %, or less than or equal to about 45 mol % based on 100 mol % of the infrared absorbing polymer. The second structural unit may be included in an amount of greater than or equal to about 50 mol %, greater than or equal to about 51 mol %, greater than or equal to about 52 mol %, greater than or equal to about 53 mol %, greater than or equal to about 54 mol %, or greater than or equal to about 55 mol % and less than or equal to about 80 mol %, less than or equal to about 79 mol %, less than or equal to about 78 mol %, less than or equal to about 77 mol %, less than or equal to about 76 mol %, or less than or equal to about 75 mol % based on 100 mol % of the infrared absorbing polymer. In the above amount ranges, a polymer having improved infrared absorption characteristics may be obtained.

The infrared absorbing polymer may further include a third structural unit represented by Chemical Formula 3.

[Chemical Formula 3]

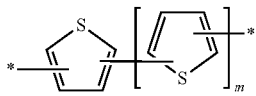

In Chemical Formula 3, m is an integer of 0 to 3, and at least one hydrogen of each aromatic ring may be replaced by deuterium, a halogen, a cyano group, a C1 to C10 alkyl group, a C1 to C10 haloalkyl group, a —$SiH_3$ group, or a C1 to C10 alkylsilyl group.

The third structural unit may be included in an amount of greater than or equal to about 40 parts by mole, greater than or equal to about 41 parts by mole, greater than or equal to about 42 parts by mole, greater than or equal to about 43 parts by mole, greater than or equal to about 44 parts by mole, or greater than or equal to about 45 parts by mole and less than or equal to about 300 parts by mole, less than or equal to about 290 parts by mole, less than or equal to about 280 parts by mole, less than or equal to about 270 parts by mole, less than or equal to about 260 parts by mole, less than or equal to about 250 parts by mole, or less than or equal to about 240 parts by mole based on 100 parts by mole of a sum of the first structural unit and the second structural unit. In the above amount ranges, a polymer having improved infrared absorption characteristics may be obtained.

The polymer including the first structural unit, the second structural unit, and optionally the third structural unit may be an alternating copolymer or a random copolymer.

The polymer may have a number average molecular weight of greater than or equal to about 1,000 g/mol, for example greater than or equal to about 1,500 g/mol, greater than or equal to about 2,000 g/mol, greater than or equal to about 2,500 g/mol, greater than or equal to about 3,000 g/mol, greater than or equal to about 3,500 g/mol, or greater than or equal to about 4,000 g/mol and less than or equal to about 80,000 g/mol, for example less than or equal to about 75,000 g/mol, less than or equal to about 70,000 g/mol, less than or equal to about 65,000 g/mol, less than or equal to about 60,000 g/mol, less than or equal to about 55,000 g/mol, or less than or equal to about 50,000 g/mol.

For example, the polymer may be represented by Group 1.

[Group 1]

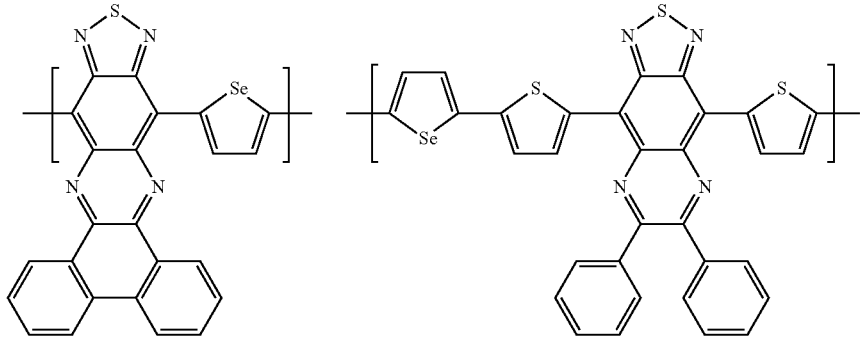

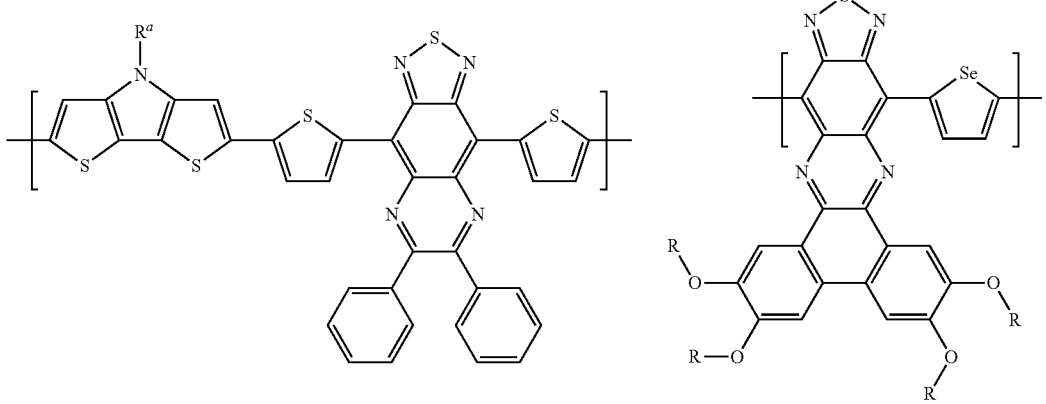

-continued
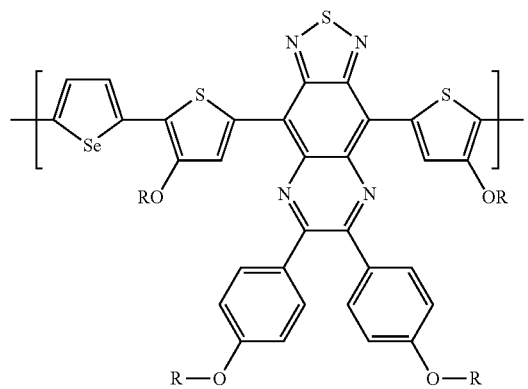
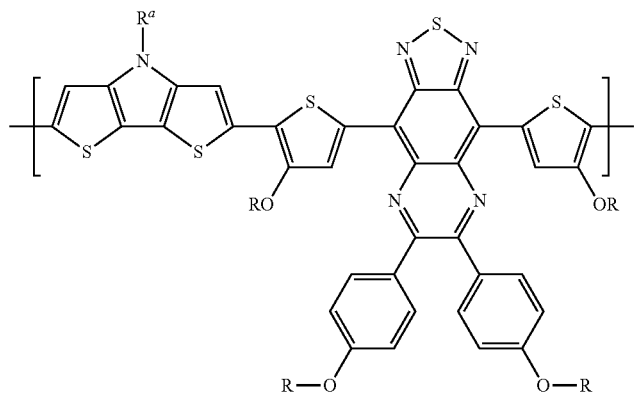
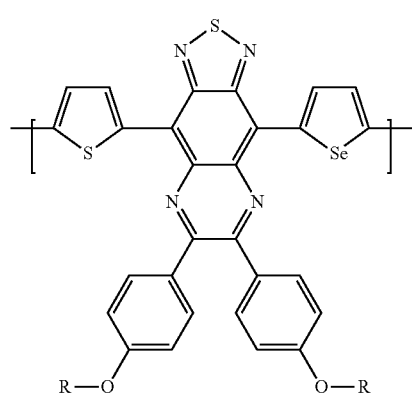
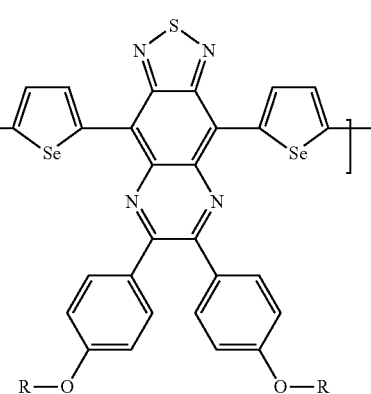
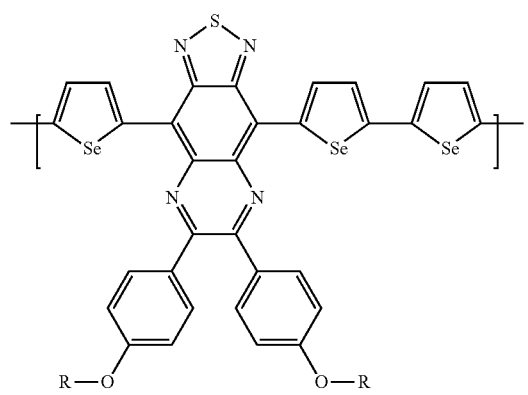
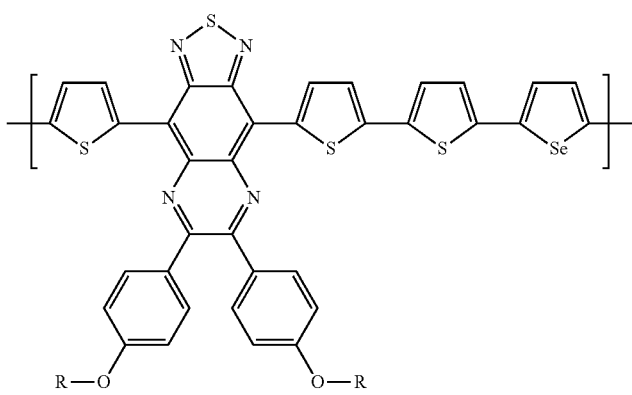
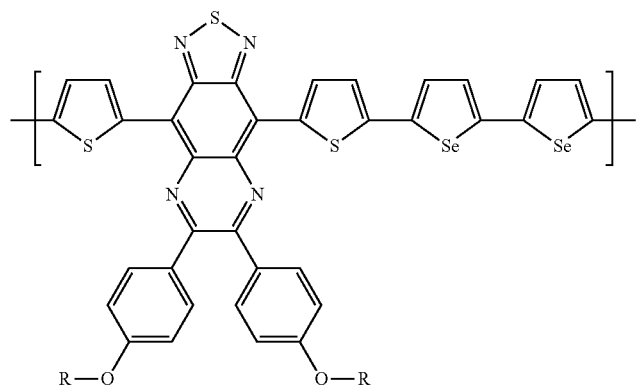

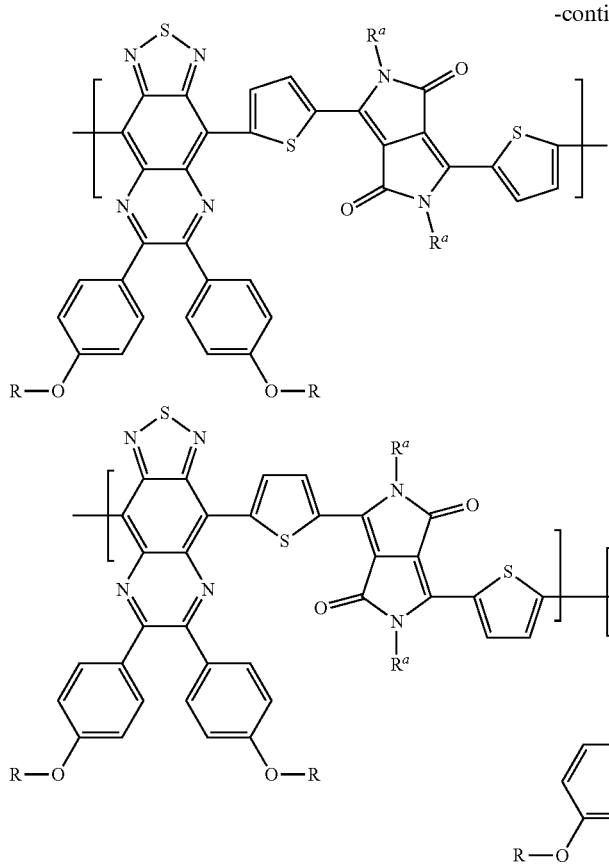
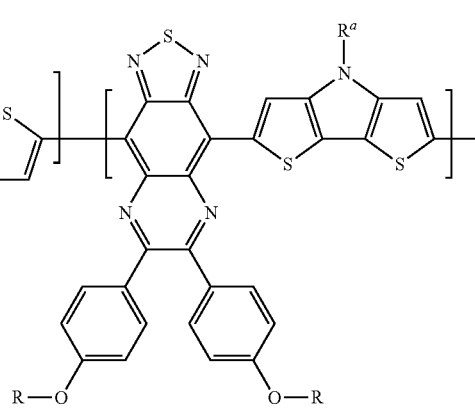

In Group 1,

OR is a C1 to C30 alkoxy group or a C6 to C30 aryloxy group, and a plurality of OR's in one polymer may be the same or different from each other, $R^a$ is hydrogen, a halogen, a substituted or unsubstituted C1 to C10 alkyl group, or a substituted or unsubstituted C6 to C10 aryl group, and at least one hydrogen of each aromatic ring may be replaced by deuterium, a halogen, a cyano group, a C1 to C10 alkyl group, a C1 to C10 haloalkyl group, a —$SiH_3$ group, or a C1 to C10 alkylsilyl group.

The infrared absorbing polymer may absorb light in the infrared wavelength region, and the peak absorption wavelength (Amax) of the infrared absorbing polymer may belong to, for example, greater than or equal to about 750 nm, for example greater than or equal to about 780 nm, greater than or equal to about 790 nm, greater than or equal to about 800 nm, greater than or equal to about 810 nm, greater than or equal to about 820 nm, or greater than or equal to about 830 nm. The peak absorption wavelength (Amax) of the infrared absorbing polymer may belong to, for example, a wavelength range of about 750 nm to about 3000 nm, and within the range, for example, about 750 nm to about 2500 nm, about 780 nm to about 2200 nm, about 790 nm to about 2100 nm, about 800 nm to about 2000 nm, about 810 nm to about 2000 nm, about 820 nm to about 2000 nm, or about 830 nm to about 2000 nm.

The infrared absorbing polymer may exhibit good charge transfer characteristics, and has good photoelectric conversion characteristics for absorbing light and converting it into an electrical signal, and thus may be effectively used as a photoelectric conversion material for a photoelectric device.

Another embodiment provides an infrared absorbing/blocking film including the infrared absorbing polymer.

The infrared absorbing/blocking film may be applied to various fields requiring light absorption characteristics in an infrared wavelength region.

Since the infrared absorbing polymer has both light absorption characteristics and photoelectric characteristics in an infrared (including near-infrared) wavelength region, it may be effectively used as a photoelectric conversion material.

Figure 1B:
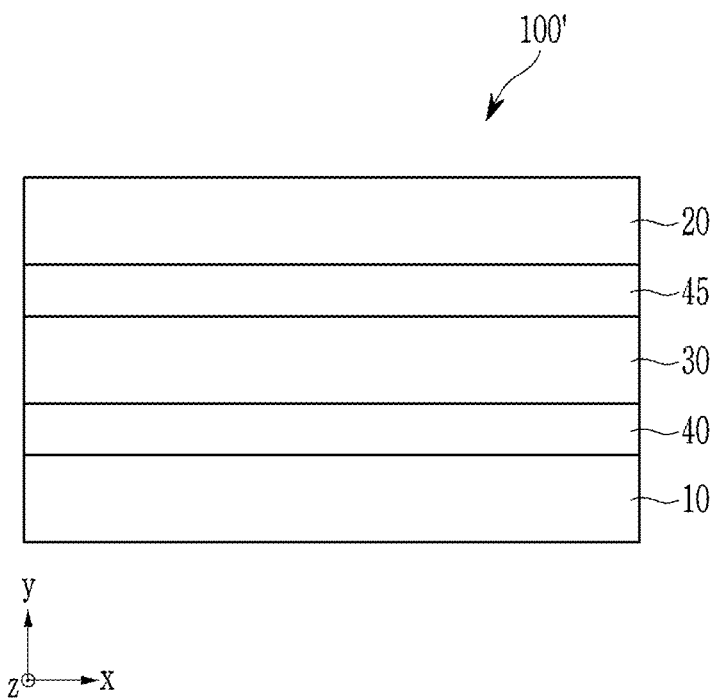

FIGS. 1A and 1B are cross-sectional views showing photoelectric devices according to embodiments, Referring to FIG. 1A, a photoelectric device 100 according to an embodiment includes a first electrode 10 and a second electrode 20 facing each other, and a photoactive layer 30 between the first electrode 10 and the second electrode 20.

A substrate (not shown) may be disposed at the side of the first electrode 10 or the second electrode 20. The substrate may be for example made of an inorganic material such as glass; an organic material such as polycarbonate, polymethylmethacrylate, polyethyleneterephthalate, polyethylenenaphthalate, polyamide, polyethersulfone, or a combination thereof; or a silicon wafer. The substrate may be omitted.

One of the first electrode 10 and the second electrode 20 is an anode and the other is a cathode. For example, the first electrode 10 may be an anode and the second electrode 20 may be a cathode.

At least one of the first electrode 10 and the second electrode 20 may be a light-transmitting electrode and the light-transmitting electrode may be for example made of a conductive oxide such as an indium tin oxide (ITO), indium zinc oxide (IZO), zinc oxide (ZnO), tin oxide (SnO), aluminum tin oxide (AITO), and fluorine doped tin oxide (FTO), or a metal thin layer of a single layer or a multilayer. When one of the first electrode 10 and the second electrode 20 is a non-light-transmitting electrode, it may be made of for example an opaque conductor such as aluminum (Al), silver (Ag), or gold (Au). For example, the first electrode 10 and the second electrode 20 may be all light-transmitting electrodes. For example, the second electrode 20 may be a light receiving electrode disposed at a light receiving side.

The photoactive layer 30 is a layer including a p-type semiconductor and an n-type semiconductor to provide a pn junction, which is a layer producing excitons by receiving light from outside and then separating holes and electrons from the produced excitons.

The p-type semiconductor and the n-type semiconductor may be independently a light-absorbing material that absorbs light in at least one part of a wavelength region and the infrared absorbing polymer may be a p-type semiconductor or an n-type semiconductor. For example, the infrared absorbing polymer may be used for a p-type semiconductor and fullerene or a fullerene derivative may be included as an n-type semiconductor.

The photoactive layer 30 may include an intrinsic layer including a p-type semiconductor and an n-type semiconductor, wherein the p-type semiconductor and the n-type semiconductor may be included in a volume ratio of about 1:9 to about 9:1, for example about 2:8 to about 8:2, about 3:7 to about 7:3, about 4:6 to about 6:4, or about 5:5.

The photoactive layer 30 may further include a p-type layer and/or an n-type layer in addition to the intrinsic layer. The p-type layer may include the aforementioned p-type semiconductor and the n-type layer may include the aforementioned n-type semiconductor. For example, they may be included in various combinations of p-type layer/I layer, I layer/n-type layer, p-type layer/I layer/n-type layer, and the like.

The photoelectric device 100 may further include a charge auxiliary layer (not shown) between the first electrode 10 and the photoactive layer 30 and/or the second electrode 20 and the photoactive layer 30. The auxiliary layer may be a charge auxiliary layer or an optical auxiliary layer. For example, as depicted in FIG. 1B, a photoelectric device 100' like the photoelectric device 100 in FIG. 1A may further include charge auxiliary layers 40 and 45 between the first electrode 10 and the photoactive layer 30, and the second electrode 20 and the photoactive layer 30. For example, the charge auxiliary layer 45 may be between the photoactive layer 30 and the second electrode 20 and/or the charge auxiliary layer 40 may be between the photoactive layer 30 and the first electrode 10. The charge auxiliary layers 40 and 45 may facilitate the transfer of holes and electrons separated from the active layer 30, so as to increase efficiency.

The charge auxiliary layers 40 and 45 may make holes and electrons separated in the photoactive layer 30 be transported easily to improve efficiency.

The charge auxiliary layers 40 and 45 may include at least one selected from a hole injection layer (HIL) for facilitating hole injection, a hole transport layer (HTL) for facilitating hole transport, an electron blocking layer (EBL) for limiting and/or preventing electron transport, an electron injection layer (EIL) for facilitating electron injection, an electron transport layer (ETL) for facilitating electron transport, and a hole blocking layer (HBL) for limiting and/or preventing hole transport.

The charge auxiliary layer may include for example an organic material, an inorganic material, or an organic-inorganic material. The organic material may be an organic material having hole or electron characteristics and the inorganic material may be for example a metal oxide such as a molybdenum oxide, a tungsten oxide, or a nickel oxide.

The charge auxiliary layer may include for example the aforementioned infrared absorbing polymer.

The optical auxiliary layer may be disposed in the light incident direction of the photoelectric device. For example, when the second electrode 20 is a light receiving electrode, it may be disposed on the photoactive layer 30. For example, the optical auxiliary layer may be disposed between the second electrode 20 and the photoactive layer 30.

The photoelectric devices 100 and 100' may further include an anti-reflection layer (not shown) on one surface of the first electrode 10 or the second electrode 20. The anti-reflection layer is disposed at a light incidence side and lowers reflectance of light of incident light and thereby light absorbance is further improved. For example, when light enters from the first electrode 10, the anti-reflection layer may be disposed on the first electrode 10 while when light enters from the second electrode 20, the anti-reflection layer may be disposed under the second electrode 20.

The anti-reflection layer may include, for example a material having a refractive index of about 1.6 to about 2.5 and may include for example at least one of a metal oxide, a metal sulfide, and an organic material having a refractive index within the ranges. The anti-reflection layer may include, for example a metal oxide such as an aluminum-containing oxide, a molybdenum-containing oxide, a tungsten-containing oxide, a vanadium-containing oxide, a rhenium-containing oxide, a niobium-containing oxide, a tantalum-containing oxide, a titanium-containing oxide, a nickel-containing oxide, a copper-containing oxide, a cobalt-containing oxide, a manganese-containing oxide, a chromium-containing oxide, a tellurium-containing oxide, or a combination thereof; a metal sulfide such as zinc sulfide; or an organic material such as an amine derivative, but is not limited thereto.

In the photoelectric devices 100 and 100', when light enters from the first electrode 10 or the second electrode 20 and the photoactive layer 30 absorbs light in a desired (and/or alternatively predetermined) wavelength region, excitons may be generated thereinside. The excitons are separated into holes and electrons in the photoactive layer 30, and the separated holes are transported to an anode that is one of the first electrode 10 and the second electrode 20 and the separated electrons are transported to the cathode that is the other of the first electrode 10 and the second electrode 20 so as to flow a current.

The photoelectric devices 100 and 100' may be applied to a sensor such as an image sensor (CMOS image sensor), a photo detector, an optical sensor (infrared light sensor), a solar cell, etc., but is not limited thereto.

The photoelectric devices 100 and 100' may be applied to, for example, a sensor. The sensor may be an organic CMOS sensor, for example, an organic CMOS infrared light sensor or an organic CMOS image sensor.

Hereinafter, an image sensor including the photoelectric device is described with reference to the drawings. For ease of description, non-limiting examples are described where the photoelectric device 100 of FIG. 1A is applied to various image sensors 300 to 700 in FIGS. 3 to 7. However, example embodiments are not limited thereto, and a photoelectric device include one or more charge auxiliary layers, such as the photoelectric device 100' in FIG. 1B of the present application, instead may be applied to the image sensors 300 to 700 in FIGS. 3 to 7 of the present application.

Figure 2:
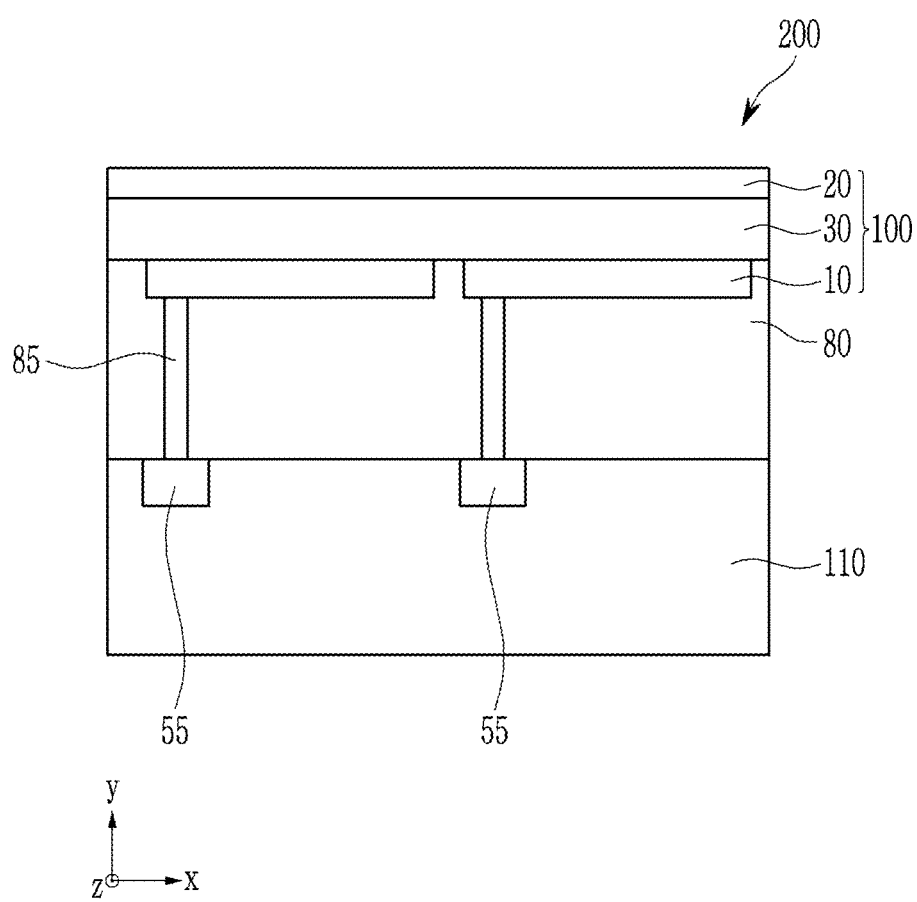
FIG. 2 is a cross-sectional view showing an image sensor according to an embodiment.

FIG. 2 is a cross-sectional view illustrating an image sensor according to an embodiment.

Referring to FIG. 2, the image sensor 200 according to an embodiment includes a semiconductor substrate 110, an insulation layer 80, and a photoelectric device 100.

The semiconductor substrate 110 may be a silicon substrate and is integrated with a transmission transistor (not shown) and a charge storage 55. The charge storage 55 may be integrated in each pixel. The charge storage 55 is electrically connected to the photoelectric device 100 and information of the charge storage 55 may be transferred by the transmission transistor.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but are not limited thereto. Further, it is not limited to the structure, and the metal wire and pad may be disposed under the semiconductor substrate 110.

The insulation layer 80 is formed on the metal wire and pad. The insulation layer 80 may be made of an inorganic insulating material such as a silicon oxide and/or a silicon nitride, or a low dielectric constant (low K) material such as SiC, SiCOH, SiCO, and SiOF. The insulation layer 60 has a trench 85 exposing the charge storage 55. The trench 85 may be filled with fillers.

The aforementioned photoelectric device 100 is formed on the insulation layer 80. As described above, the photoelectric device 100 includes a first electrode 10, a photoactive layer 30, and a second electrode 20. Even though a structure in which the first electrode 10, the photoactive layer 30 and the second electrode 20 are sequentially stacked is shown as an example in the drawing, the present disclosure is not limited to this structure, and the second electrode 20, the photoactive layer 30, and the electrodes 10 may be arranged in this order.

The first electrode 10 and the second electrode 20 may both be transparent electrodes, and the photoactive layer 30 is the same as described above. The photoactive layer 30 may selectively absorb light in an infrared wavelength region. Incident light from the side of the second electrode 20 may be photoelectrically converted by mainly absorbing light in an infrared wavelength region in the photoactive layer 30.

Focusing lens (not shown) may be further formed on the photoelectric device 100. The focusing lens may control a direction of incident light and gather the light in one region. The focusing lens may have a shape of, for example, a cylinder or a hemisphere, but is not limited thereto.

Figure 3:
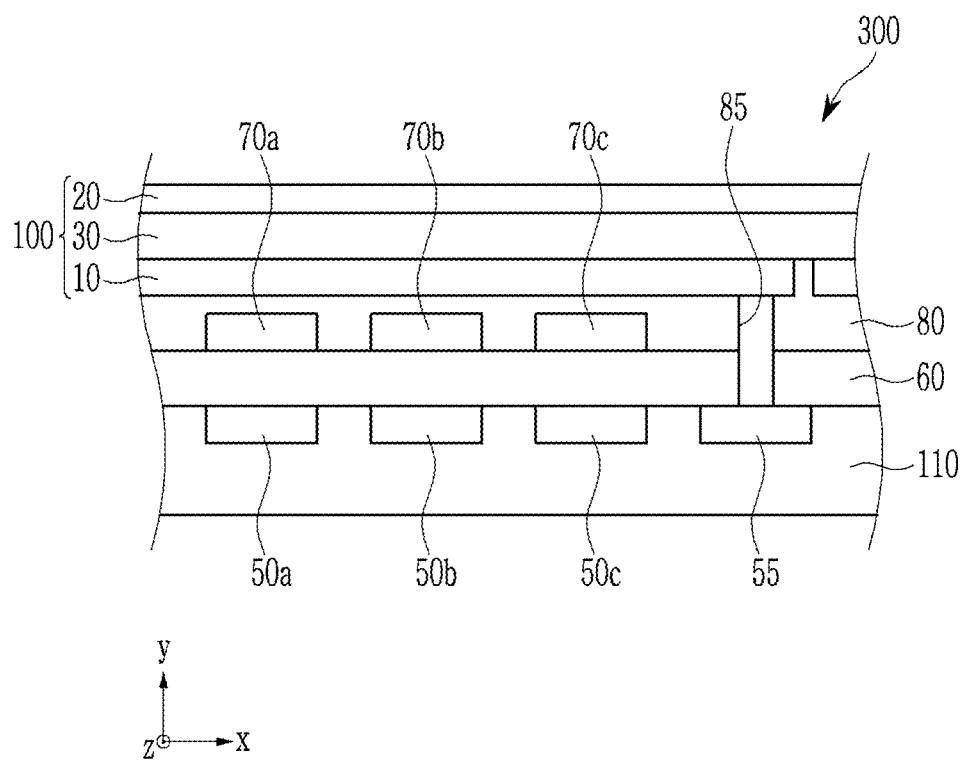
FIG. 3 is a cross-sectional view showing an image sensor according to another embodiment.

FIG. 3 is a cross-sectional view showing an image sensor according to another embodiment.

Referring to FIG. 3, an image sensor 300 according to an embodiment includes a semiconductor substrate 110 integrated with photo-sensing devices 50a, 50b, and 50c, a transmission transistor (not shown), and a charge storage 55, a lower insulation layer 60, color filter layers 70a, 70b, and 70c, an upper insulation layer 80, and a photoelectric device 100.

The semiconductor substrate 110 may be integrated with photo-sensing devices 50a, 50b, and 50c, a transmission transistor (not shown), and a charge storage 55. The photo-sensing devices 50a, 50b, and 50c may be photodiodes.

The photo-sensing devices 50a, 50b, and 50c, the transmission transistor, and/or the charge storage 55 may be integrated in each pixel. For example, the photo-sensing device 50a may be included in a red pixel, the photo-sensing device 50b may be included in a green pixel, and the photo-sensing device 50c may be included in a blue pixel.

The photo-sensing devices 50a, 50b, and 50c sense light, the information sensed by the photo-sensing devices may be transferred by the transmission transistor, the charge storage 55 is electrically connected to the photoelectric diode 100 that will be described later, and the information of the charge storage 55 may be transferred by the transmission transistor.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but are not limited thereto. Further, it is not limited to the structure, and the metal wire and pad may be disposed under the photo-sensing devices 50a and 50b.

The lower insulation layer 60 is formed on the metal wire and the pad.

Color filters 70a, 70b, and 70c are formed on the lower insulation layer 60. The color filters 70a, 70b, and 70c includes a red filter 70a formed in a red pixel, a green filter 70 formed in a green pixel, and a blue filter 70c formed in a blue pixel.

The upper insulation layer 80 is formed on the color filters 70a, 70b, and 70c. The upper insulation layer 80 eliminates steps caused by the color filters 70a, 70b, and 70c and planarizes the surface.

The aforementioned photoelectric device 100 is formed on the upper insulation layer 80. As described above, the photoelectric device 100 includes a first electrode 10, a photoactive layer 30, and a second electrode 20. Even though a structure in which the first electrode 10, the photoactive layer 30 and the second electrode 20 are sequentially stacked is shown as an example in the drawing, the present disclosure is not limited to this structure, and the second electrode 20, the photoactive layer 30, and the electrodes 10 may be arranged in this order.

The first electrode 10 and the second electrode 20 may both be transparent electrodes, and the photoactive layer 30 is the same as described above. The photoactive layer 30 may selectively absorb light in an infrared wavelength region.

Incident light from the side of the second electrode 20 may be photoelectrically converted by mainly absorbing light in an infrared wavelength region in the photoactive layer 30. Light in the remaining wavelength region may pass through the first electrode 10 and the color filters 70a, 70b, and 70c, the light in a red wavelength region passing through the color filter 70a may be sensed by the photo-sensing device 50a, the light in a green wavelength region passing through the color filter 70b may be sensed by the photo-sensing device 50b, and the light in a blue wavelength region passing through the color filter 70c may be sensed by the photo-sensing device 50c.

Figure 4:
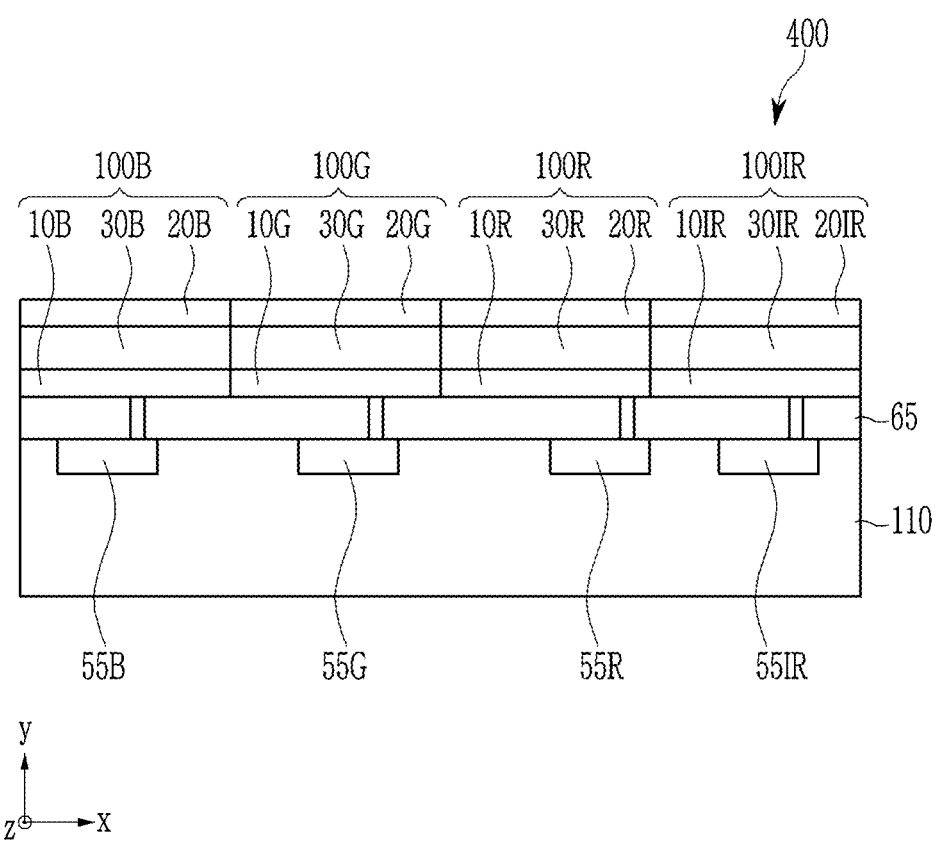
FIG. 4 is a cross-sectional view showing an image sensor according to another embodiment.

FIG. 4 is a cross-sectional view showing an image sensor according to another embodiment.

Referring to FIG. 4, the image sensor 400 according to the present embodiment includes a semiconductor substrate 110 in which an infrared light charge storage 55IR, a blue light charge storage 55B, a green light charge storage 55G, a red light charge storage 55R, and a transmission transistor (not shown) is integrated, a lower insulation layer 65, a blue photo-sensing device 100B, a green photo-sensing device 100G, a red photo-sensing device 100R, and infrared photo-sensing device 100IR.

The semiconductor substrate 110 may be a silicon substrate, and an infrared light charge storage 55IR, a blue light charge storage 55B, a green photo charge storage 55G, a red photo charge storage 55R, and a transfer transistor (not shown) Not) is integrated. The blue light charge storage 55B, the green light charge storage 55G, and the red light charge storage 55R may be integrated for each blue pixel, green pixel, and red pixel.

The infrared light charge storage 55IR, the blue light charge storage 55B, the green light charge storage 55G, and the red light charge storage 55R are portions in which charges absorbed by the infrared photo-sensing device 100IR, the blue photo-sensing device 100B, the green photo-sensing device 100G, and the red photo-sensing device 100R are transferred and collected, and each may be electrically connected to the infrared photo-sensing device 100IR, the blue photo-sensing device 100B, the green photo-sensing device 100G, and the red photo-sensing device 100R.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but are not limited thereto.

The lower insulation layer 65 may be formed on the metal wire and pad. The lower insulation layer 65 may be made of an inorganic insulation material such as a silicon oxide and/or a silicon nitride, or a low dielectric constant (low K) material such as SiC, SiCOH, SiCO, and SiOF.

The blue photo-sensing device 100B, the green photo-sensing device 100G, the red photo-sensing device 100R, and the infrared photo-sensing device 100IR are formed on the lower insulation layer 65. The blue photo-sensing device 100B includes a first electrode 10B, a second electrode 20B, and a photoactive layer 30B selectively absorbing light in a blue wavelength region, the green photo-sensing device 100G includes a first electrode 10G, a second electrode 20G, and a photoactive layer 30G selectively absorbing light in a green wavelength region, the red photo-sensing device 100R includes a first electrode 10R, a second electrode 20R, and a photoactive layer 30R selectively absorbing light in a red wavelength region, and the infrared photo-sensing device 100IR includes a first electrode 10IR, a second electrode 20IR, and a photoactive layer 301R selectively absorbing light in an infrared light wavelength region.

The first electrodes 10B, 10G, 10R, and 10IR and the second electrodes 20B, 20G, 20R, and 20IR may be light-transmitting electrodes and may be made of, for example, a transparent conductor such as indium tin oxide (ITO), indium zinc oxide (IZO), zinc oxide (ZnO), tin oxide (SnO), aluminum tin oxide (AITO), and fluorine-doped tin oxide (FTO), or may be a metal thin layer having a thin thickness of several nanometers or several tens of nanometers or a metal thin layer having a thin thickness of several nanometers to several tens of nanometers doped with a metal oxide.

The photoactive layers 30B, 30G, 30R, and 30IR may include a p-type semiconductor material and an n-type semiconductor material. The photoactive layer 30B of the blue photo-sensing device 100B may include a p-type semiconductor compound selectively absorbing light in a blue wavelength region and an n-type semiconductor compound selectively absorbing light in a blue wavelength region, the photoactive layer 30G of the green photo-sensing device 100G may include a p-type semiconductor compound selectively absorbing light in a green wavelength region and an n-type semiconductor compound selectively absorbing light in a green wavelength region, the photoactive layer 30R of the red photo-sensing device 100R may include a p-type semiconductor compound selectively absorbing light in a red wavelength region and an n-type semiconductor compound selectively absorbing light in a red wavelength region, and the photoactive layer 30IR of the infrared photo-sensing device 100IR may include the aforementioned infrared absorbing polymer. The infrared photo-sensing device 100IR may selectively absorb light in an infrared region of greater than or equal to about 800 nm and less than or equal to about 3000 nm without absorption of the visible light region.

Figure 5:
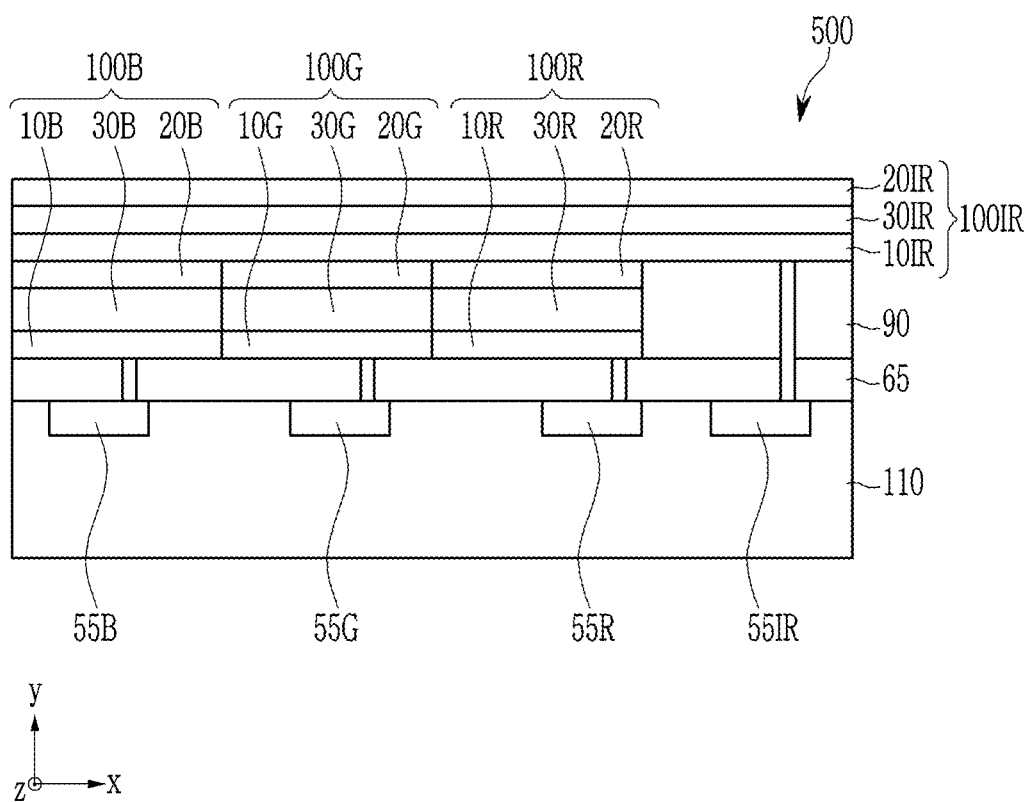
FIG. 5 is a cross-sectional view showing an image sensor according to another embodiment.

FIG. 5 is a cross-sectional view showing an image sensor according to another embodiment.

Referring to FIG. 5, an image sensor 500 includes a semiconductor substrate 110 in which an infrared light charge storage 55IR, a blue light charge storage 55B, a green light charge storage 55G, a red light charge storage 55R and transmission transistor (not shown) are integrated, a lower insulation layer 65, an upper insulation layer 90, a blue photo-sensing device 100B, a green photo-sensing device 100G, a red photo-sensing device 100R, and an infrared photo-sensing device 100IR. The infrared photo-sensing device 100IR is formed on the whole surface of the blue photo-sensing device 100B, the green photo-sensing device 100G, and the red photo-sensing device 100R. The rest of the configuration is the same as the image sensor shown in FIG. 4, except the infrared photo-sensing device 100IR also extends on the upper insulation layer 90.

Figure 6:
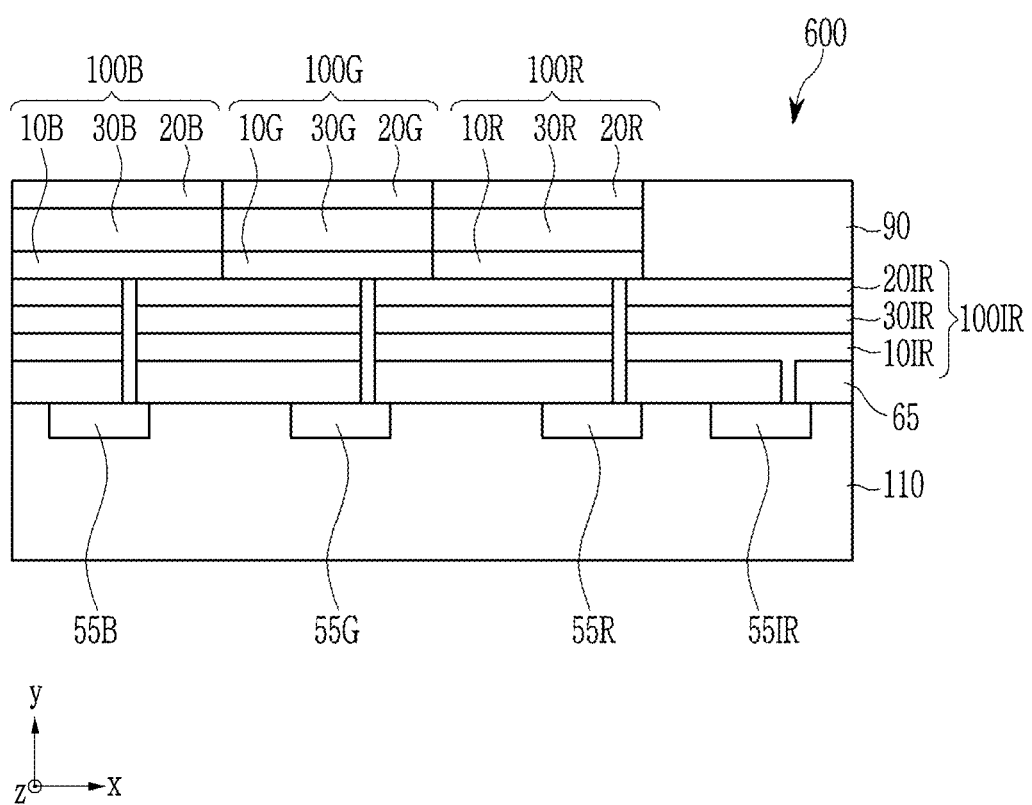
FIG. 6 is a cross-sectional view showing an image sensor according to an embodiment.

In the configuration of FIG. 5, the infrared photo-sensing device 100IR is present on the lower insulation layer 65, and the blue photo-sensing device 100B, the green photo-sensing device 100G, and the red photo-sensing device 100R may be disposed thereon. An image sensor 600 having such a configuration is shown in FIG. 6.

The infrared photo-sensing device 100IR may selectively absorb light in an infrared region of greater than or equal to about 800 nm and less than or equal to about 3000 nm, and improve efficiency by having a large absorption area.

The image sensor according to an embodiment may include a plurality of sensors having different functions. For example, at least one of the plurality of sensors having different functions may be a biometric sensor, and the biometric sensor may be for example an iris sensor, a depth sensor, a fingerprint sensor, a blood vessel distribution sensor, and the like, but is not limited thereto.

For example, one of a plurality of image sensors having different functions may be an iris sensor and the other may be a depth sensor. The iris sensor identifies a person by using unique iris characteristics of every person and specifically, taking an image of an eye of a user within an appropriate distance, processing the image, and comparing it with his/her stored image. The depth sensor identifies a shape and a location of an object from its three-dimensional information by taking an image of the object within an appropriate distance with a user and processing the image. This depth sensor may be for example used as a face recognition sensor.

In an embodiment, a plurality of sensors may include, for example a first infrared light sensor configured to sense light in an infrared region having a first wavelength ($\lambda_1$) in an infrared wavelength region and a second infrared light sensor configured to sense light in an infrared region having a second wavelength ($\lambda_2$) in an infrared wavelength region.

The first wavelength ($\lambda_1$) and the second wavelength ($\lambda_2$) may be for example different in a wavelength region of about 800 nm to about 3000 nm, and for example a difference between the first wavelength ($\lambda_1$) and the second wavelength ($\lambda_2$) may be greater than or equal to about 30 nm, greater than or equal to about 50 nm, greater than or equal to about 70 nm, greater than or equal to about 80 nm, or greater than or equal to about 90 nm.

For example, one of the first wavelength ($\lambda_1$) and the second wavelength ($\lambda_2$) may belong to a wavelength region of about 780 nm to about 900 nm and the other of the first wavelength ($\lambda_1$) and the second wavelength ($\lambda_2$) may belong to a wavelength region of about 830 nm to about 1000 nm.

For example, one of the first wavelength ($\lambda_1$) and the second wavelength ($\lambda_2$) may belong to a wavelength region of about 780 nm to about 840 nm and the other of the first wavelength ($\lambda_1$) and the second wavelength ($\lambda_2$) may belong to a wavelength region of about 910 nm to about 970 nm.

For example, one of the first wavelength ($\lambda_1$) and the second wavelength ($\lambda_2$) may belong to a wavelength region of about 800 nm to about 830 nm and the other of the first wavelength ($\lambda_1$) and the second wavelength ($\lambda_2$) may belong to a wavelength region of about 930 nm to about 950 nm.

For example, one of the first wavelength ($\lambda_1$) and the second wavelength ($\lambda_2$) may belong to a wavelength region of about 805 nm to about 815 nm and the other of the first wavelength ($\lambda_1$) and the second wavelength ($\lambda_2$) may belong to a wavelength region of about 935 nm to about 945 nm.

For example, one of the first wavelength ($\lambda_1$) and the second wavelength ($\lambda_2$) may about 810 nm and the other of the first wavelength ($\lambda_1$) and the second wavelength ($\lambda_2$) may be about 940 nm.

Figure 7:
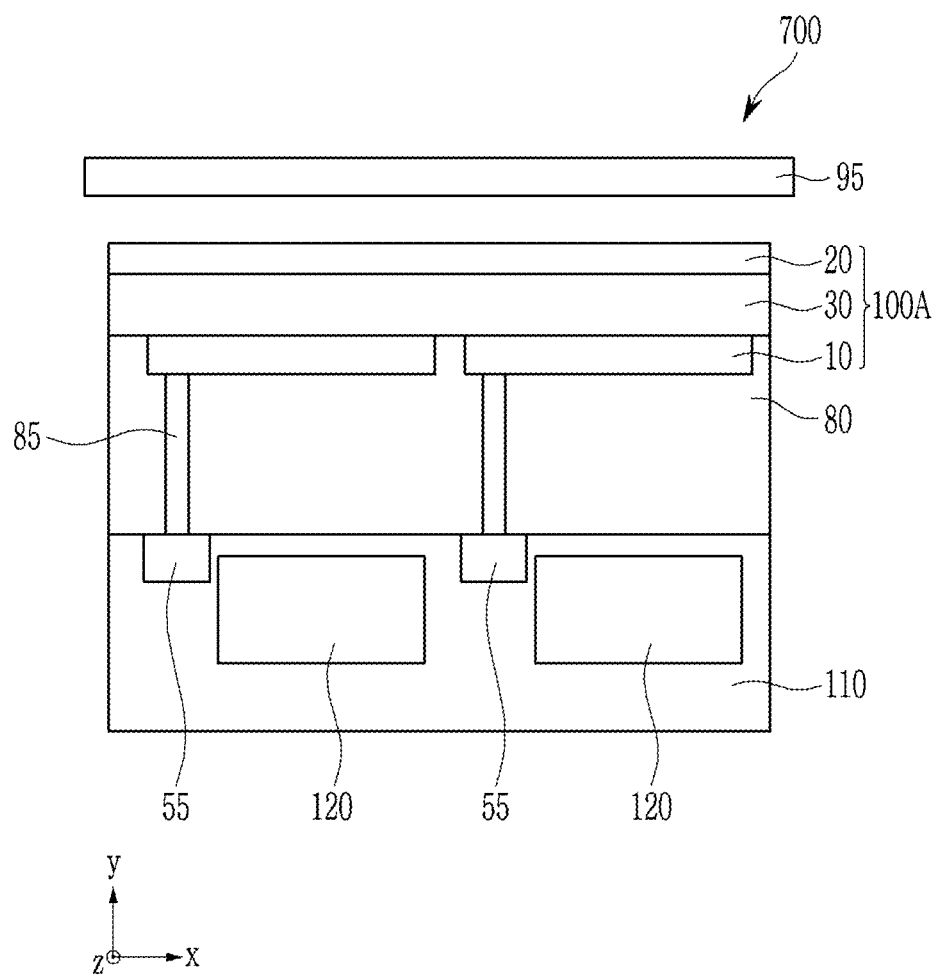
FIG. 7 is a cross-sectional view showing an image sensor according to an embodiment.

FIG. 7 is a cross-sectional view showing an image sensor including a plurality of sensors according to an embodiment.

The image sensor 700 according to the present embodiment includes a dual bandpass filter 95, a first infrared light sensor 100A, an insulation layer 80, and a semiconductor substrate 110 integrated with a second infrared light sensor 120. The first infrared light sensor 100A and the second infrared light sensor 120 may be stacked.

The dual bandpass filter 95 may be disposed on a front side of the image sensor 700 and may selectively transmit infrared light including the first wavelength ($\lambda_1$) and infrared light including the second wavelength ($\lambda_2$) and may block and/or absorb other light. Herein, other light may include light in an ultraviolet (UV) and visible region.

The first infrared light sensor 100A includes a first electrode 10, a photoactive layer 30, and a second electrode 20. The first infrared light sensor 100A may be the same as the photoelectric device 100 according to the aforementioned embodiment.

The second infrared light sensor 120 may be integrated in the semiconductor substrate 110 and may be a photo-sensing device. The semiconductor substrate 110 may be for example a silicon substrate and may be integrated with the second infrared light sensor 120, the charge storage 55, and a transmission transistor (not shown).

The second infrared light sensor 120 may be a photodiode and may sense entered light, and sensed information is transferred by the transmission transistor. Herein, the light entered into the second infrared light sensor 120 is light that passes the dual bandpass filter 95 and the first infrared light sensor 100A and may be infrared light in a desired (and/or alternatively predetermined) region including the second wavelength ($\lambda_2$). All infrared light in a desired (and/or alternatively predetermined) region including the first wavelength ($\lambda_1$) may be absorbed by the photoactive layer 30 and may not reach the second infrared light sensor 120. In this case, a separate filter for wavelength selectivity with respect to the light entered into the second infrared light sensor 120 is not separately needed. However, for the time when all infrared light in a desired (and/or alternatively predetermined) region including the first wavelength ($\lambda_1$) is not absorbed by the photoactive layer 30, a filter between the first infrared light sensor 100A and the second infrared light sensor 120 may be further disposed.

The sensor according to the present embodiment may include two infrared light sensors respectively performing separately functions and thus may work as a combination sensor. In addition, two sensors performing separately functions are stacked in each pixel, and thus the number of pixel performing functioning of each sensor is twice increased while maintaining a size and resultantly, sensitivity may be much improved.

The aforementioned image sensor may be applied to various electronic devices, such as cameras, camcorders, mobile phones, display devices, security devices, or medical devices, but is not limited thereto.

Figure 8:
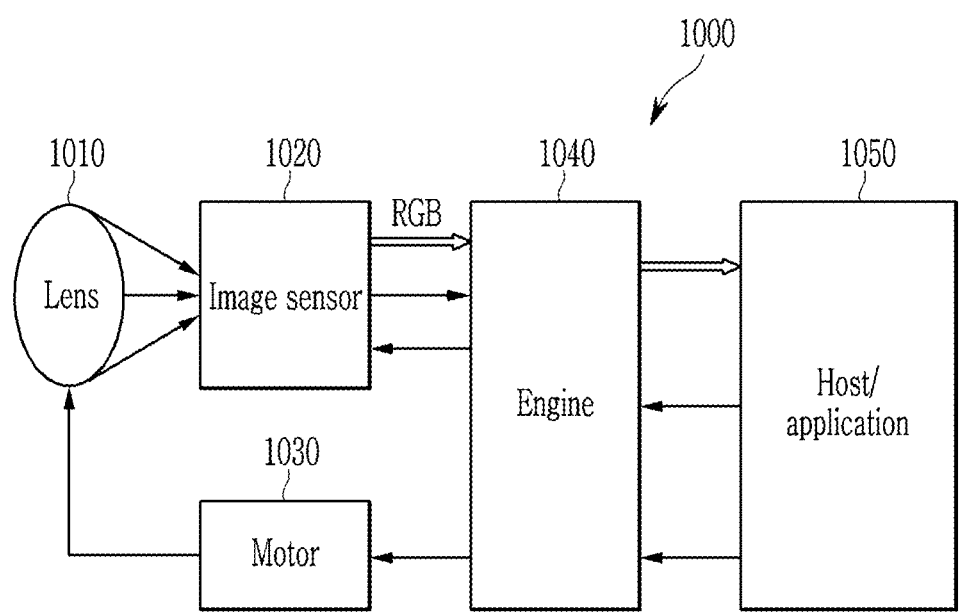
FIG. 8 is a block diagram of a digital camera including an image sensor according to an embodiment.

FIG. 8 is a block diagram of a digital camera including an image sensor according to an embodiment.

Referring to FIG. 8, a digital camera 1000 includes a lens 1010, an image sensor 1020, a motor 1030, and an engine 1040. The image sensor 1020 may be one of image sensors according to embodiments shown in FIGS. 2 to 7.

The lens 1010 concentrates incident light on the image sensor 1020. The image sensor 1020 generates RGB data for received light through the lens 1010.

In an embodiment, the image sensor 1020 may interface with the engine 1040.

The motor 1030 may adjust the focus of the lens 1010 or perform shuttering in response to a control signal received from the engine 1040. The engine 1040 may control the image sensor 1020 and the motor 1030.

The engine 1040 may be connected to a host/application 1050.

Figure 9:
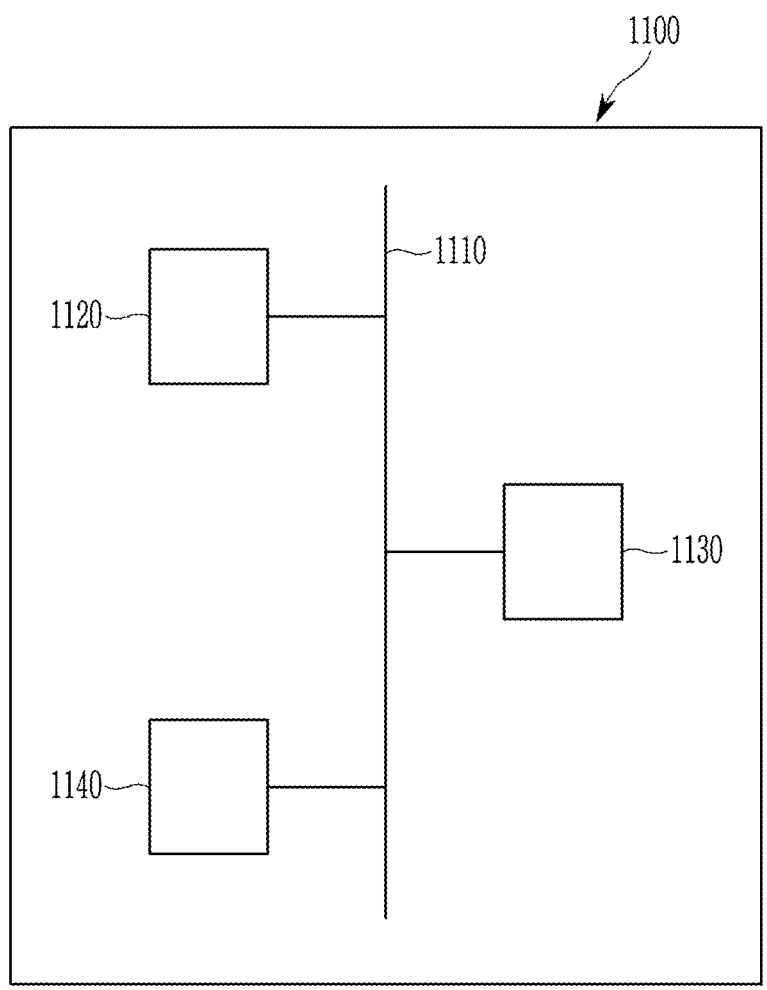
FIG. 9 is a block diagram of an electronic device according to an embodiment.

FIG. 9 is a block diagram of an electronic device according to an embodiment.

Referring to FIG. 9, an electronic device 1100 may include a processor 1120, a memory 1130, and an image sensor 1140 that are electrically coupled together via a bus 1110. The image sensor 1140 may be an image sensor according to one of the aforementioned embodiments. The memory 1130, which may be a non-transitory computer readable medium, may store a program of instructions and/or other information. The memory 1130 may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM). The processor 1120 may execute the stored program of instructions to perform one or more functions. For example, the processor 1120 may be configured to process electrical signals generated by the image sensor 1140. The processor 1120 may be configured to generate an output (e.g., an image to be displayed on a display interface) based on such as processing.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Hereinafter, the embodiments are illustrated in more detail with reference to examples. However, these examples are non-limiting examples, and the present scope is not limited thereto.

SYNTHESIS EXAMPLES

Synthesis Example 1-1: Synthesis of Polymer (Polymer 1) Including Structural Unit Represented by Chemical Formula 1-1

[Chemical Formula 1-1]

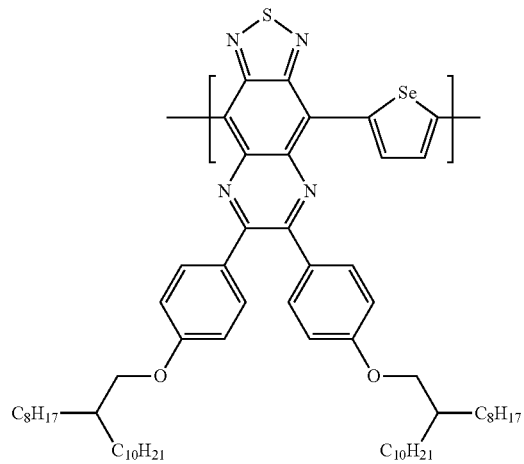

(1) Synthesis Example 1-1a (Synthesis of Monomer A)

As shown in Reaction Scheme 1-1a, Compounds 2 to 6 are synthesized according to a method described in J. Am. Chem. Soc. 2014, 136, 11901193 and Compound 6 is used to synthesize an acceptor structure, Monomer A (4,9-dibromo-6,7-bis(4-((2-octyldodecyl)oxy)phenyl)-[1,2,5]thiadiazolo[3,4-g]quinoxaline).

$^1$H-NMR (300 MHz, CDCl$_3$): 7.78 ppm (d, 4H), 6.93 ppm (d, 4H), 3.90 ppm (d, 4H), 1.81 (m, 2H), 1.56-1.24 (m, 64H), 0.90-0.86 (m, 12H).

UPLC-MS: [M+H]$^+$ 1089.62

[Reaction Scheme 1-1a]

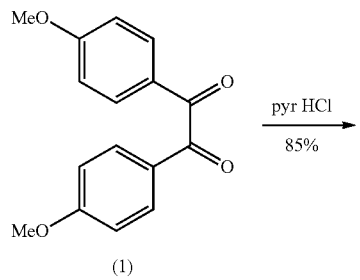

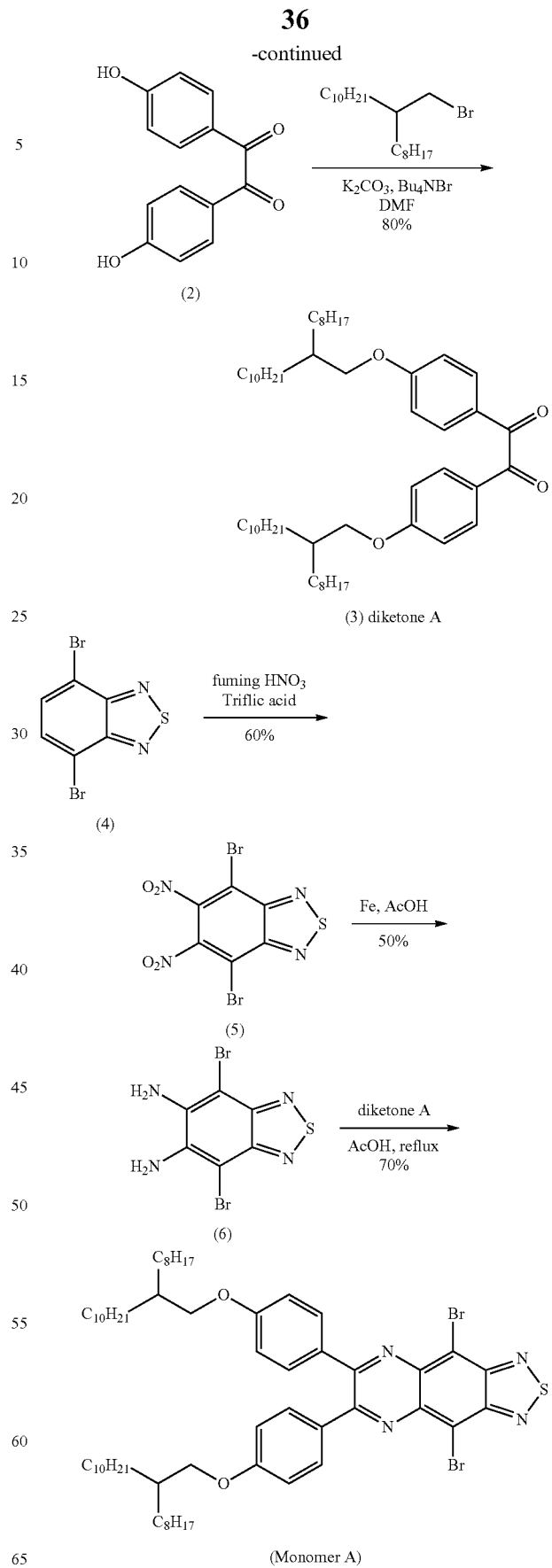

(2) Synthesis Example 1-1 b (Synthesis of Monomer B)

As shown in Reaction Scheme 1-1b, selenophene (5 g, 38 mmol) and an anhydrous THF solvent (80 mL) are put in a reaction flask under a nitrogen atmosphere and cooled down to −78° C. Subsequently, an n-butyllithium solution (1.6 M in Hexane) (59.6 mL, 95 mmol) is slowly added thereto. The mixture is stirred at −78° C. for 2 hours and then, additionally stirred at room temperature for 2 hours. The obtained suspension is cooled down to −78° C. again, and a trimethyl tin chloride solution (1 M in THF) (80.4 mL, 80 mmol) is added thereto. The reaction mixture is stirred at −78° C. for 4 hours and heated up to room temperature and then, additionally stirred for 16 hours. After completing a reaction by adding water thereto, the solution is extracted with ethylacetate and dried over sodium sulfate. After removing a solvent therefrom, the residue is recrystallized with ethanol and purified to obtain white crystals, and the white crystals are dried under a reduced pressure to obtain 6.55 g (Yield: 38%) of Monomer B (2,5-bis(trimethylstannyl)selenophene).

$^1$H-NMR (300 MHz, CDCl3): 7.68 ppm (s, 2H), −0.37 ppm (s, 18H).

$^{13}$C-NMR (300 MHz, CDCl3): 150.8 ppm, 139.3 ppm, −7.0 ppm.

[Reaction Scheme 1-1]

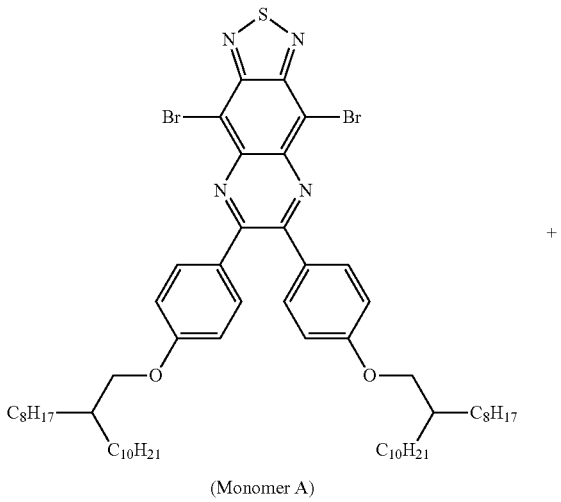

(Monomer A)

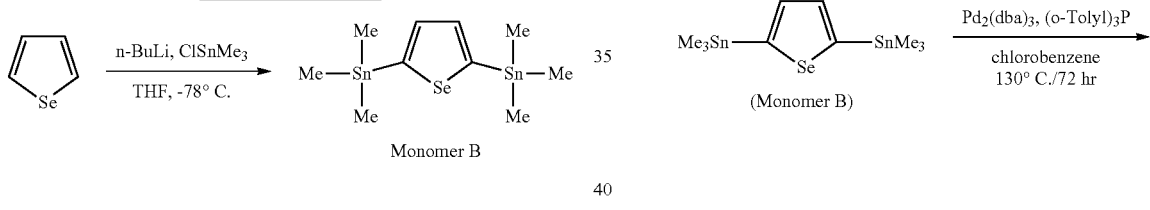

(3) Synthesis of Polymer (Polymer 1) Including Structural Unit Represented by Chemical Formula 1-1

As shown in Reaction Scheme 1-1, Monomer A (460.2 mg, 0.422 mmol), Monomer B (192.6 mg, 0.422 mmol), Pd$_2$(dba)$_3$ (3.9 mg, 4.2 μmol), and tri(o-tolyl)phosphine (10.3 mg, 34.0 μmol) are put in a reaction flask, and then, the inside of the reaction vessel is sufficiently substituted with nitrogen gas. After putting anhydrous chlorobenzene (12.0 mL) degassed by bubbling with nitrogen gas in the reaction vessel, the reactants are dissolved, and the reaction vessel is additionally substituted with nitrogen gas for 30 minutes. The mixture is stirred for 72 hours, while heated at 130° C. and then, poured into methanol to form precipitates. The precipitates are filtered under a reduced pressure and then, purified by Soxhlet with methanol for 12 hours, acetone for 12 hours, hexane for 12 hours, and chloroform for 6 hours. The chloroform solution is concentrated with a rotary evaporator and then, re-precipitated in methanol to obtain 364 mg (Yield: 81%) of a polymer including a structural unit represented by Chemical Formula 1-1 (Polymer 1, a number average molecular weight (Mn)=4,024 g/mol, PDI=1.66).

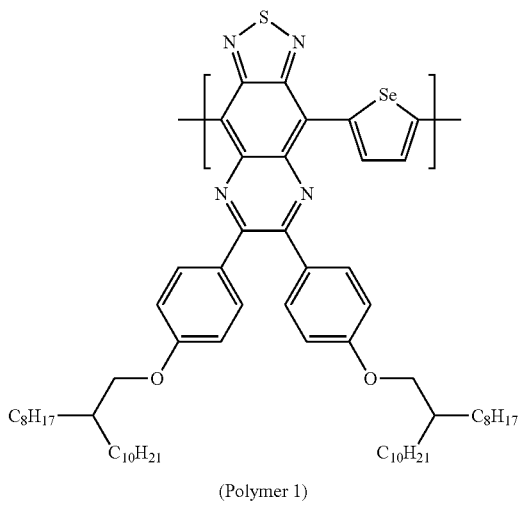

(Polymer 1)

Synthesis Example 2: Synthesis of Polymer (Polymer 2) Including Structural Unit Represented by Chemical Formula 1-2

[Chemical Formula 1-2]

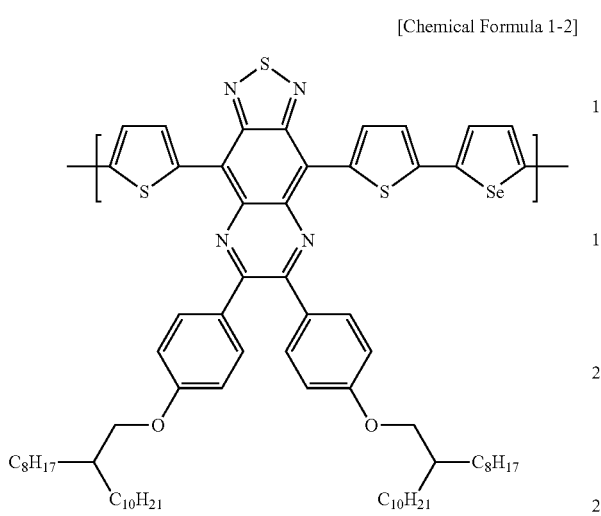

(1) Synthesis Example 1-2a

As shown in Reaction Scheme 1-2a, Monomer A of Synthesis Example 1-1a (2.06 g, 1.9 mmol) and Pd(PPh$_3$)$_4$ (24 mg, 20.8 μmol) prepared by dissolving 2-(tributylstannyl)thiophene(2-(tributhylstannyl)thiophene) (1.76 g, 4.7 mmol) in anhydrous toluene (30 mL) are put in a reaction flask. Subsequently, the mixture is heated at 110° C. and stirred and refluxed for 12 hours. The reactant is cooled down to room temperature, and a reaction solvent is distilled under a reduced pressure with a rotary evaporator. The obtained mixed material is purified through column chromatography (a developing solvent: dichloromethane/hexane, a filler: silica (SiO$_2$) gel) to obtain an intermediate (Yield: 1.80 g, 94%).

UPLC-MS: [M+]$^+$ 1097.83

[Reaction Scheme 1-2a]

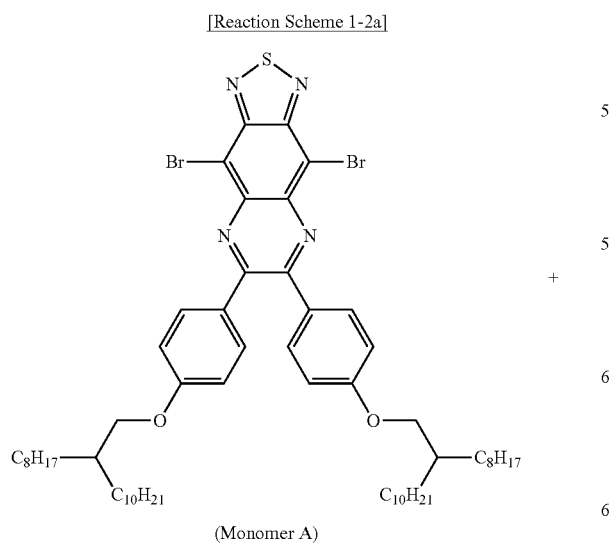

(Monomer A)

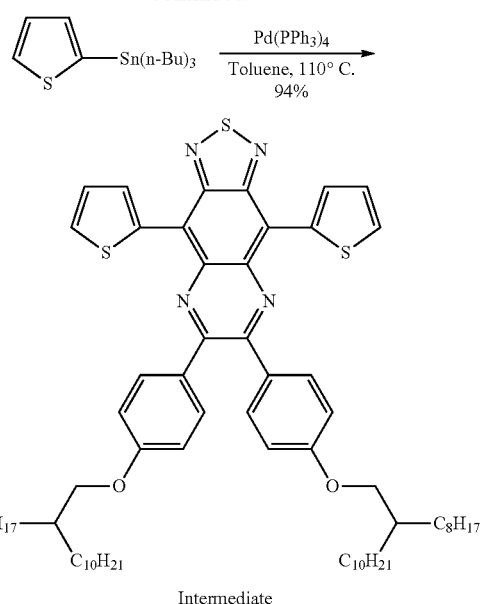

Intermediate

(2) Synthesis Example 1-2b: Synthesis of Monomer C

After dissolving the obtained intermediate (1.48 g, 1.35 mmol) dissolved in dichloromethane (32 mL), N-bromosuccinimide (0.53 g, 2.98 mmol) is all at once added thereto in an ice bath. After reacting them at room temperature for 12 hours, 30 mL of distilled water is added thereto to complete the reaction. The dichloromethane solution is washed with salt water and dried with anhydrous magnesium sulfate, and then, the reaction solvent is distilled under a reduced pressure with a rotatory evaporator. The obtained mixed material is purified through column chromatography (a developing solvent: dichloromethane/hexane, a filler: silica (SiO$_2$) gel) to obtain 1.53 g (Yield: 90%) of Monomer C.

UPLC-MS: [M+H]$^+$ 1255.64

[Reaction Scheme 1-2b]

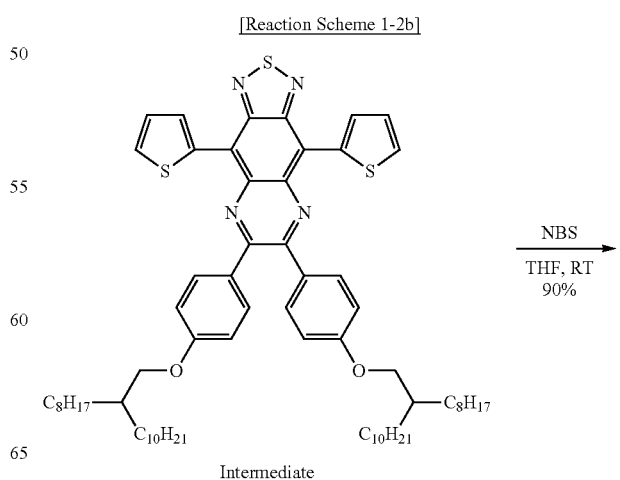

Intermediate

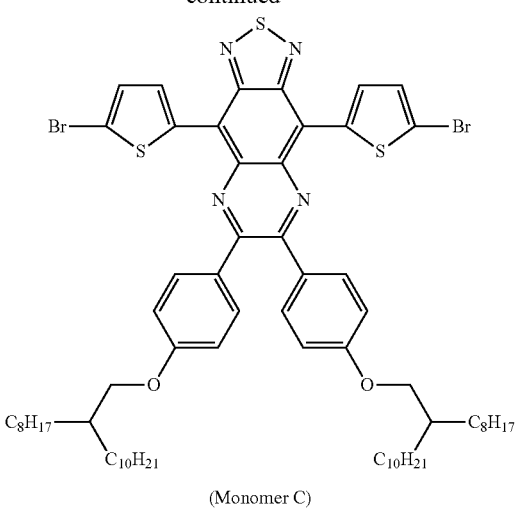

(Monomer C)

(3) Synthesis of Polymer (Polymer 2) Including Structural Unit Represented by Chemical Formula 1-2

As shown in Reaction Scheme 1-2, 201 mg (Yield: 93%) of a polymer including a structural unit represented by Chemical Formula 1-2 (Polymer 2, a number average molecular weight (Mn)=6,615 g/mol, PDI=1.81) is obtained according to the same method as the step (3) of Synthesis Example 1-1 except that Monomer C (221 mg, 0.176 mmol), Monomer B (80.5 mg, 0.176 mmol), $Pd_2(dba)_3$ (3.2 mg, 3.5 μmol), tri(o-tolyl)phosphine (4.3 mg, 14.2 μmol), and anhydrous chlorobenzene (4.0 mL) are used.

[Reaction Scheme 1-2]

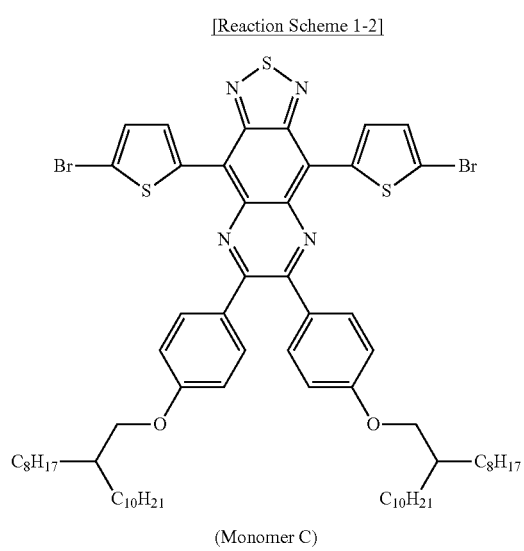

(Monomer C)

+

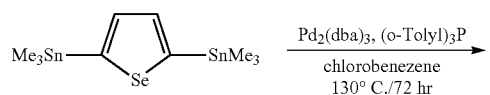

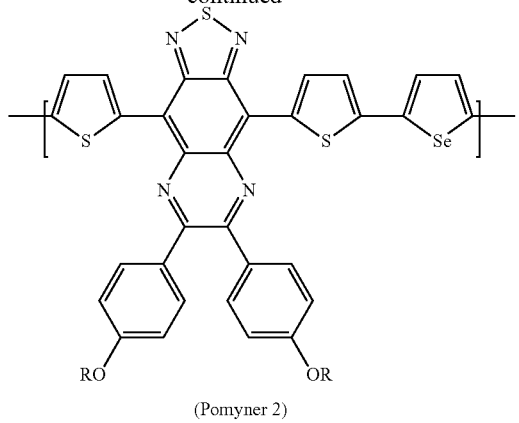

(Pomyner 2)

Synthesis Example 3: Synthesis of Polymer (Polymer 3) Including Structural Unit Represented by Chemical Formula 1-3

[Chemical Formula 1-3]

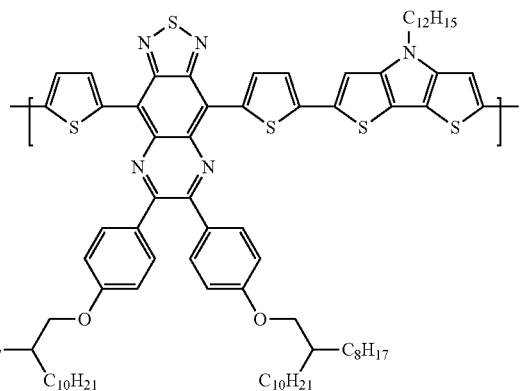

As shown in Reaction Scheme 1-3, 212 mg (Yield: 90%) of a polymer including a structural unit represented by Chemical Formula 1-3 (Polymer 3, a number average molecular weight (Mn)=1,445 g/mol, PDI=2.86) is synthesized according to the same method as the step (3) of Synthesis Example 1-1 except that Monomer C (204 mg, 0.163 mmol), 4-dodecyl-2,6-bis(trimethylstannyl)-4H-dithieno[3,2-b:2',3'-d]pyrrole (SunaTech Inc) (109.4 mg, 0.163 mmol), $Pd_2(dba)_3$ (3.0 mg, 3.3 μmol), tri(o-tolyl)phosphine (4.0 mg, 13.1 μmol), and anhydrous chlorobenzene (4.1 mL) are used.

43

[Reaction Scheme 1-3]

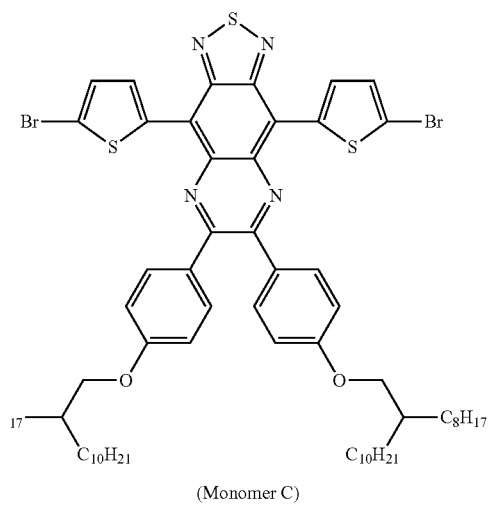

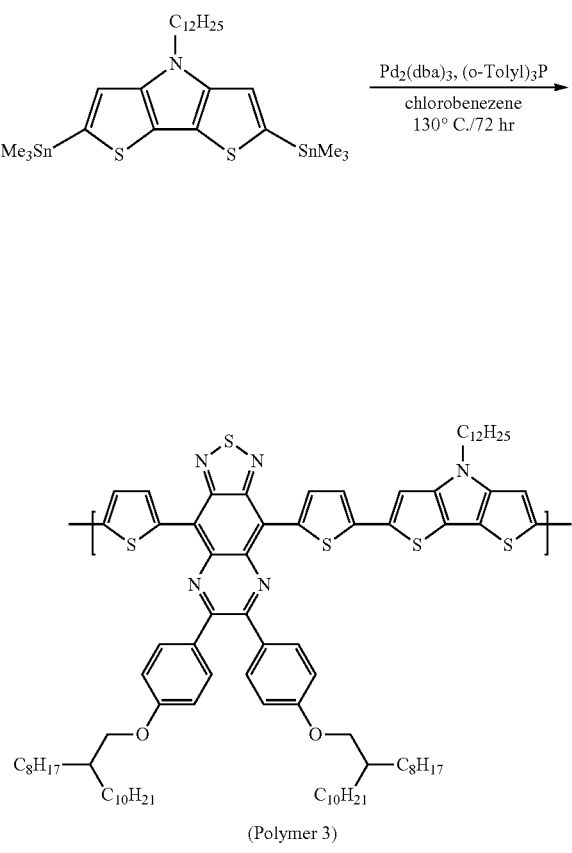

44

Synthesis Example 4: Synthesis of Polymer (Polymer 4) Including Structural Unit Represented by Chemical Formula 1-4

[Chemical Formula 1-4]

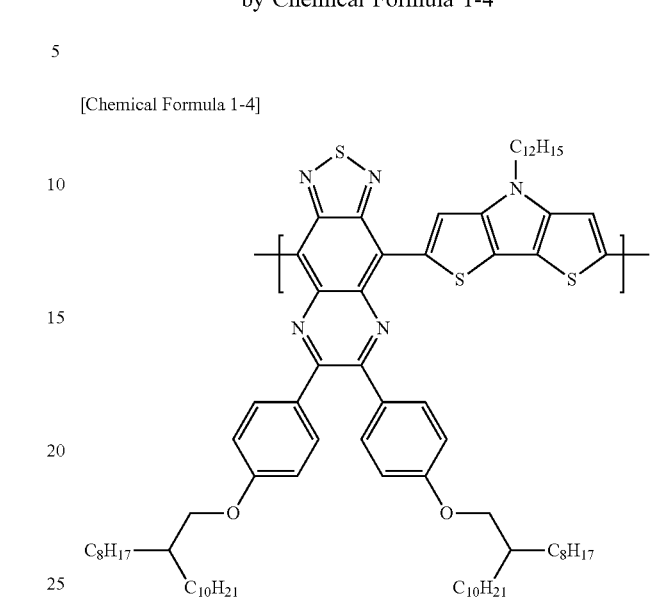

As shown in Reaction Scheme 1-4, 173 mg (Yield: 76%) of a polymer including a structural unit represented by Chemical Formula 1-4 (Polymer 4, a number average molecular weight (Mn)=5,723 g/mol, PDI=1.95) is synthesized according to the same method as the step (3) of Synthesis Example 1-1 except that Monomer C (178 mg, 0.163 mmol), 4-dodecyl-2,6-bis(trimethylstannyl)-4H-dithieno[3,2-b:2',3'-d]pyrrole (109.8 mg, 0.163 mmol, IN1441 made by SunaTech Inc.), Pd$_2$(dba)$_3$ (3.0 mg, 3.3 μmol), tri(o-tolyl)phosphine (4.0 mg, 13.1 μmol), and anhydrous chlorobenzene (4.0 mL) are used.

[Reaction Scheme 1-4]

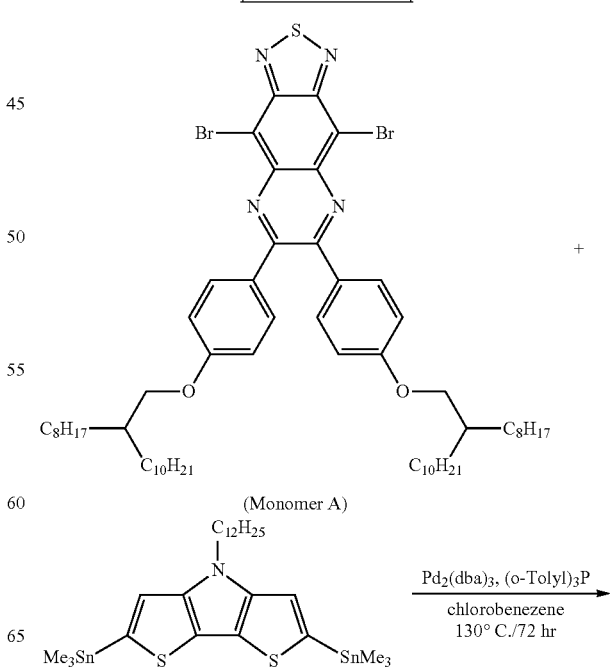

-continued

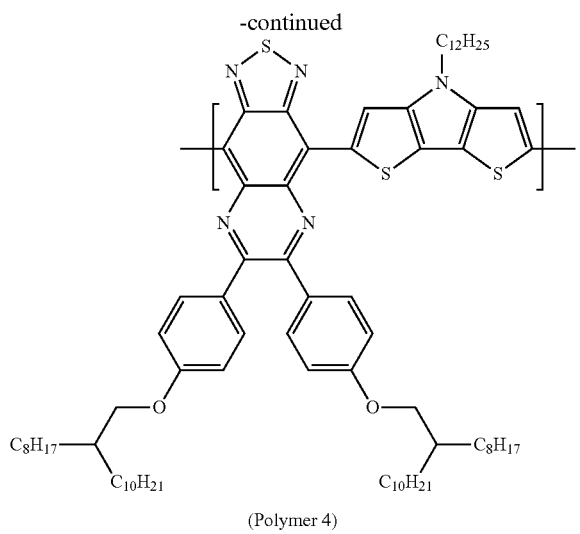

(Polymer 4)

Synthesis Example 5: Synthesis of Polymer (Polymer 5) Including Structural Unit Represented by Chemical Formula 1-5

[Chemical Formula 1-5]

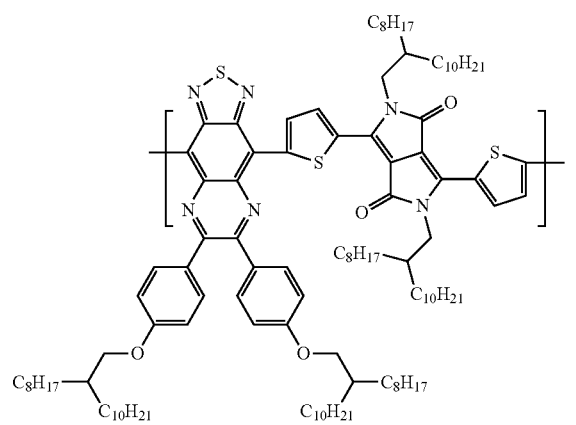

As shown in Reaction Scheme 1-5, Monomer A (215.0 mg, 0.197 mmol), 2,5-bis(2-octyldodecyl)-3,6-bis(5-(4,4,5,5-tetramethyl-1,3,2-dioxaborolan-2-yl)thiophen-2-yl)pyrrolo[3,4-c]pyrrole-1,4(2H,5H)-dione) (219.4 mg, 0.197 mmol) (SunaTech Inc.), Pd$_2$(dba)$_3$ (6.0 mg, 6.5 μmol), tri(o-tolyl)phosphine (12.0 mg, 39.4 μmol), and anhydrous toluene (13.0 mL) are put in a reaction flask, and the reactants are dissolved. After sufficiently substituting the inside of the reaction vessel with nitrogen gas, a degassed 1 M K$_3$PO$_4$ aqueous solution (1.38 mL) is added thereto. The mixture is heated at 100° C. and stirred for 72 hours, and methanol/water are poured thereinto to provide a precipitated solid compound. The precipitated solid compound is washed several times with water and methanol, filtered under a reduced pressure, and purified by Soxhlet with methanol for 12 hours, acetone for 12 hours, hexane for 12 hours, and chloroform for 6 hours. The chloroform solution is concentrated with a rotary evaporator and re-precipitated in methanol to obtain 147 mg (Yield: 42%) of a polymer including a structural unit represented by Chemical Formula 1-5 (Polymer 5, a number average molecular weight (Mn)=6,767 g/mol, PDI=1.98).

[Reaction Scheme 1-5]

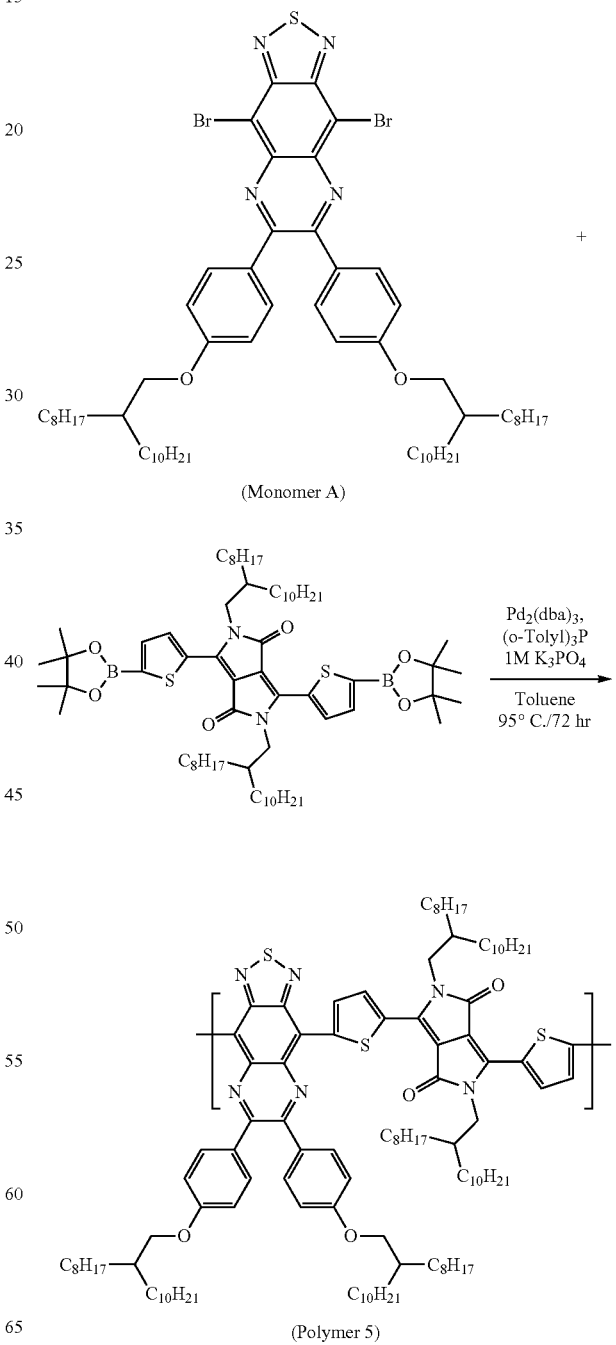

Synthesis Example 6: Synthesis of Polymer (Polymer 6) Represented by Chemical Formula 1-6

[Chemical Formula 1-6]

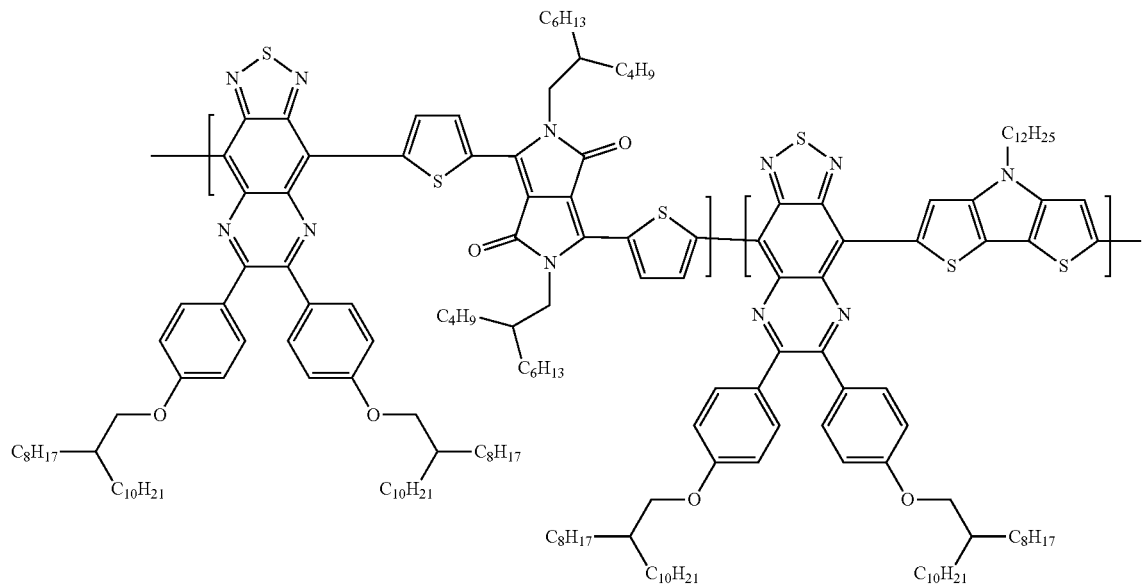

As shown in Reaction Scheme 1-6, 274 mg (Yield: 64%) of a polymer including a structural unit represented by Chemical Formula 1-6 (Polymer 6, a number average molecular weight (Mn)=3,920 g/mol, PDI=2.48) is synthesized according to the same method as the step (3) of Synthesis Example 1-1 except that Monomer A (326 mg, 0.298 mmol), 2,5-bis(2-butyloctyl)-3,6-bis(5-(trimethylstannyl)thiophen-2-yl)pyrrolo[3,4-c]pyrrole-1,4(2H,5H)-dione) (143.8 mg, 0.149 mmol) (SunaTech Inc.), 4-dodecyl-2,6-bis(trimethylstannyl)-4H-dithieno[3,2-b:2',3'-d]pyrrole (100.6 mg, 0.149 mmol) (SunaTech Inc.), $Pd_2(dba)_3$ (5.5 mg, 6.0 μmol), tri(o-tolyl)phosphine (7.3 mg, 24.0 μmol), and anhydrous chlorobenzene (11.4 mL) are used.

[Reaction Scheme 1-6]

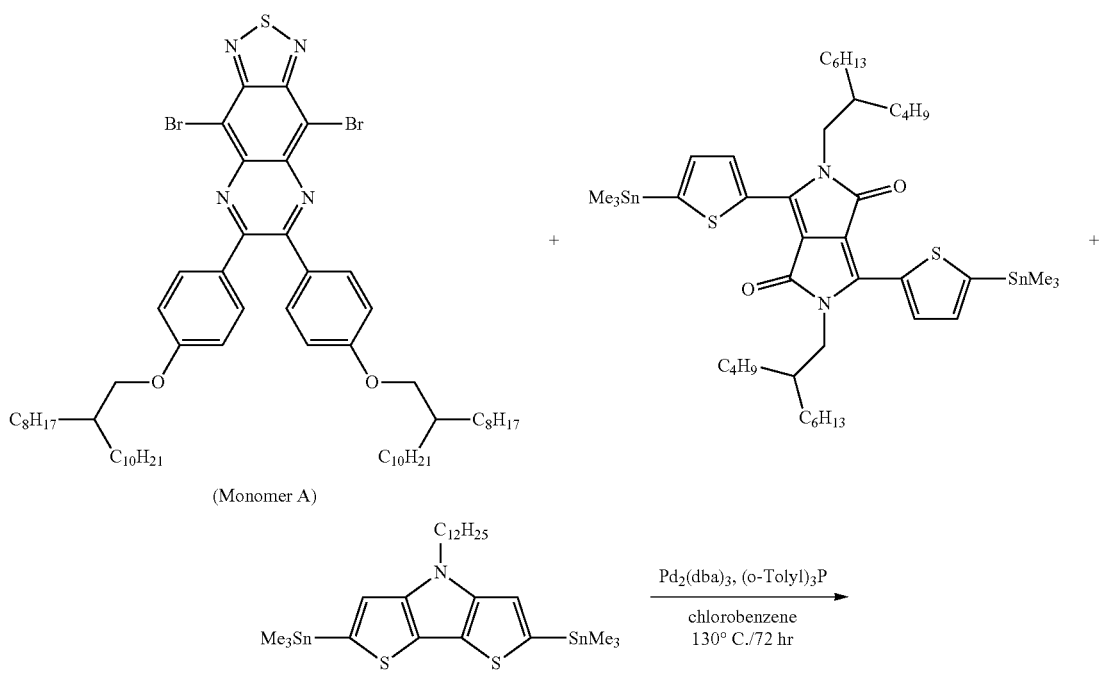

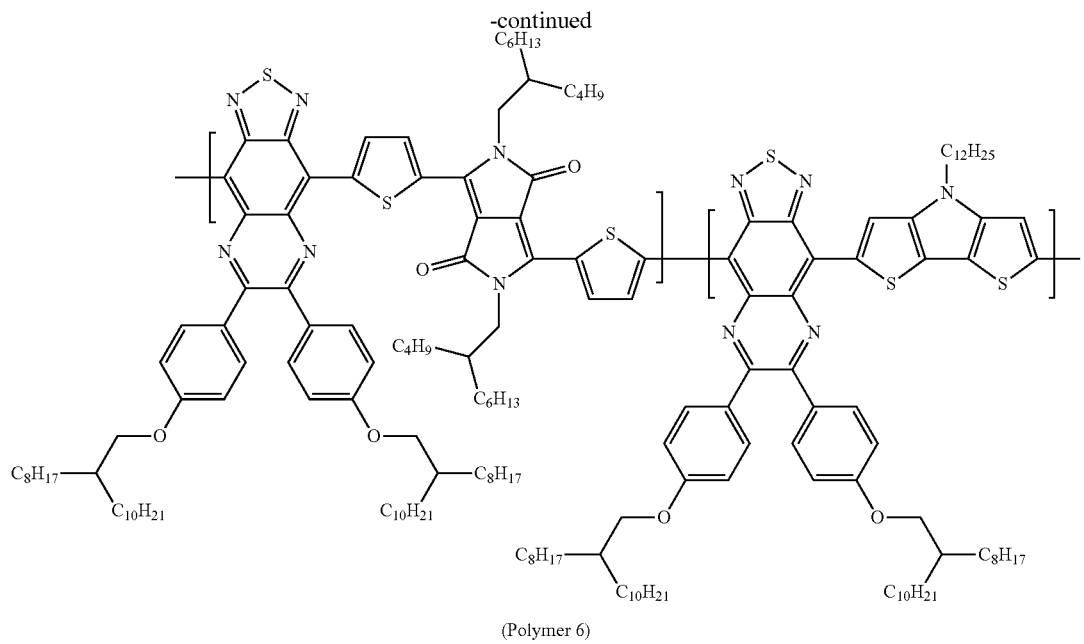

(Polymer 6)

Synthesis Example 7: Synthesis of Polymer (Polymer 7) Including Structural Unit Represented by Chemical Formula 1-7

[Chemical Formula 1-7]

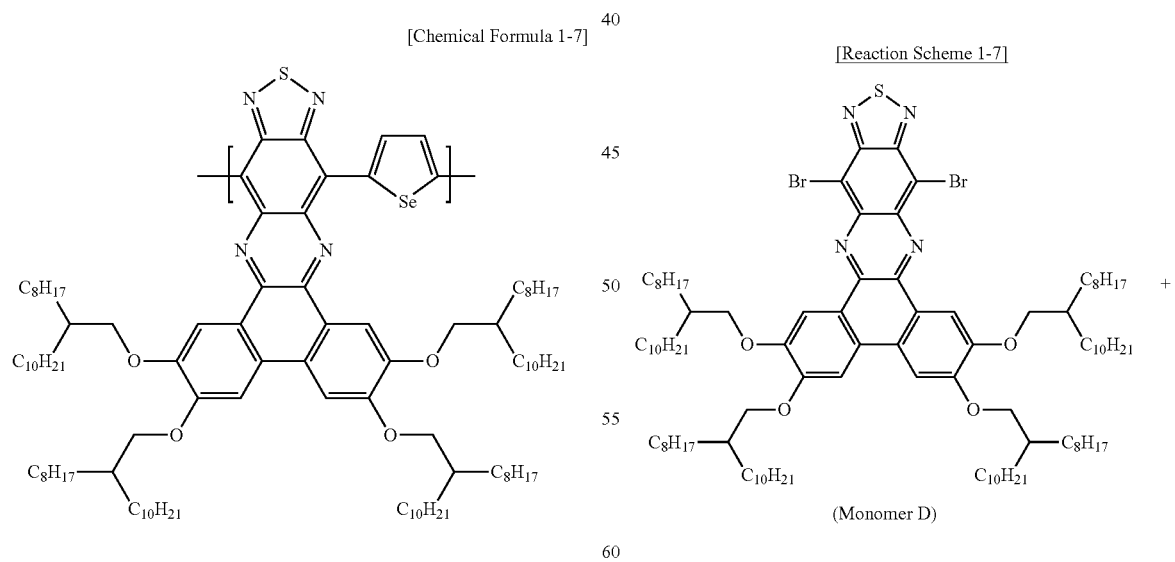

As shown in Reaction Scheme 1-7, 125 mg (Yield: 60%) of a polymer including a structural unit represented by Chemical Formula 1-7 (Polymer 7, a number average molecular weight (Mn)=5,380 g/mol, PDI=1.93) is synthesized according to the same method as the step (3) of Synthesis Example 1-1 except that Monomer D (10,14-dibromo-2,3,6,7-tetrakis((2-octyldodecyl)oxy)dibenzo[a,c] [1,2,5]thiadiazolo[3,4-i]phenazine) (221 mg, 0.126 mmol), Monomer B (57.5 mg, 0.126 mmol), Pd$_2$(dba)$_3$ (2.5 mg, 2.8 μmol), tri(o-tolyl)phosphine (6.3 mg, 20.7 μmol), and anhydrous chlorobenzene (4.0 mL) are used.

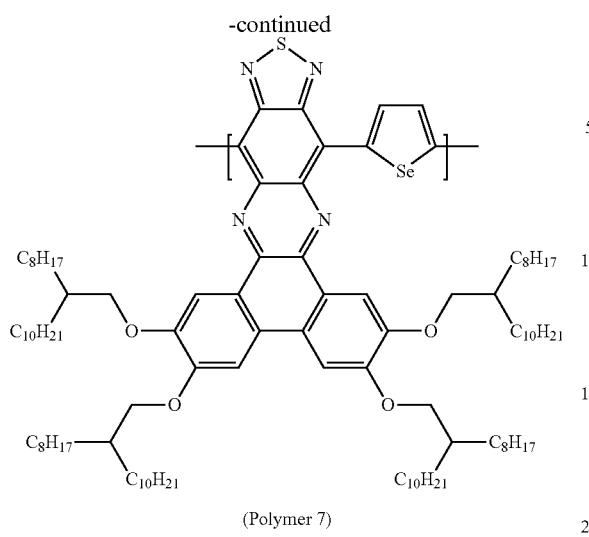

(Polymer 7)

Synthesis Example 8: Synthesis of Polymer (Polymer 8) Including Structural Unit Represented by Chemical Formula 1-8

[Chemical Formula 1-8]

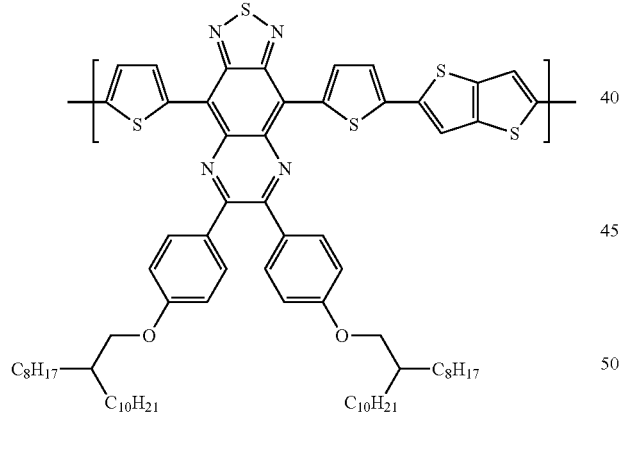

As shown in Reaction Scheme 1-8, 340 mg (Yield: 98%) of a polymer including the structural unit represented by Chemical Formula 1-8 (Polymer 8, number average molecular weight (Mn)=2,593 g/mol, PDI=5.3) is obtained according to the same method as the step (3) of Synthesis Example 1-1 except that Monomer C (351 mg, 0.280 mmol), 2,5-bis(trimethylstannyl)thieno[3,2-b]thiophene (130 mg, 0.280 mmol), $Pd_2(dba)_3$ (10.5 mg, 11.1 μmol), tri(o-tolyl)phosphine (14.0 mg, 44.5 μmol), and dichlorobenzene (5.0 mL) are reacted at 180° C. for 1 hour.

[Reaction Scheme 1-8]

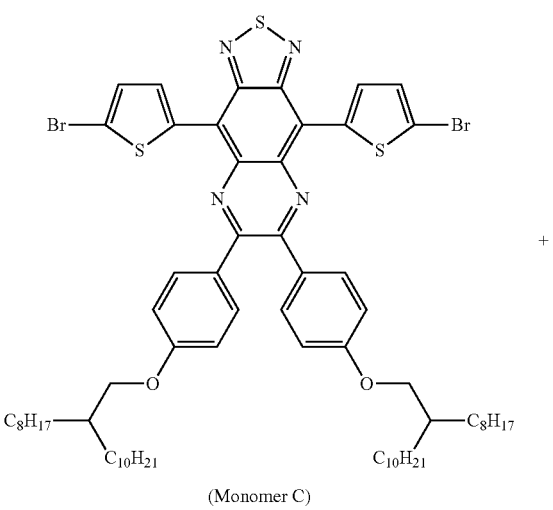

(Monomer C)

+

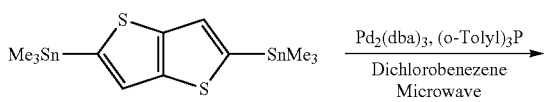

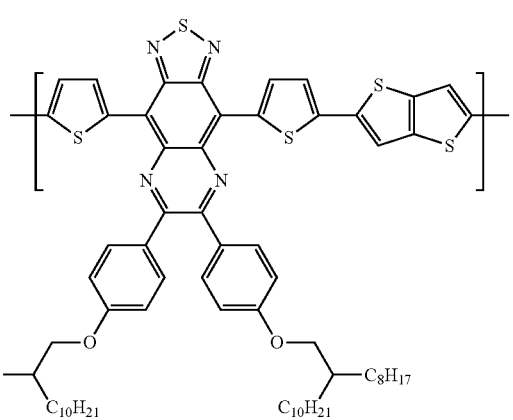

(Polymer 8)

Synthesis Example 9: Synthesis of Polymer (Polymer 9) Including Structural Unit Represented by Chemical Formula 1-9

[Chemical Formula 1-9]

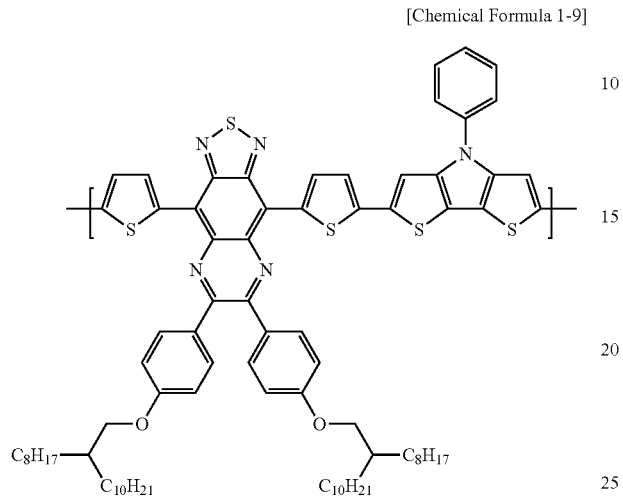

As shown in Reaction Scheme 1-9, 350 mg (Yield: 93%) of a polymer including the structural unit represented by Chemical Formula 1-9 (Polymer 9, number average molecular weight (Mn)=2,275 g/mol, PDI=1.04) is obtained according to the same method as the step (3) of Synthesis Example 1-1 except that Monomer C (350 mg, 0.278 mmol), 4-phenyl-2,6-bis(trimethylstannyl)-4H-dithieno[3,2-b:2',3'-d]pyrrole (162 mg, 0.280 mmol), Pd$_2$(dba)$_3$ (10.5 mg, 11.1 µmol), tri(o-tolyl)phosphine (14.0 mg, 44.5 µmol), and dichlorobenzene (5.0 mL) are reacted at 180° C. for 1 hour.

[Reaction Scheme 1-9]

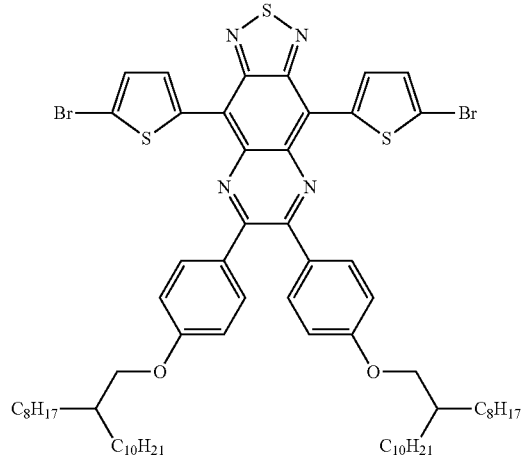

(Monomer C)

+

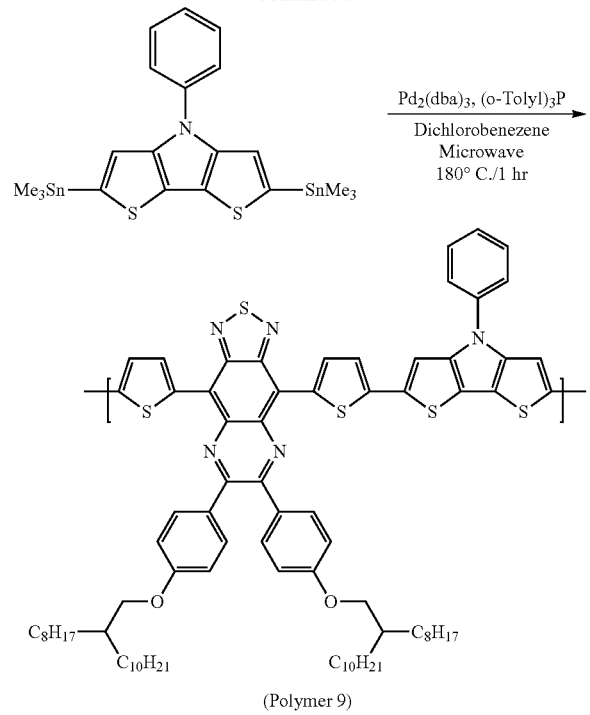

(Polymer 9)

Comparative Synthesis Example 1: Synthesis of Polymer (Comparative Polymer 1)) Including Structural Unit Represented by Chemical Formula 2-1

[Chemical Formula 2-1]

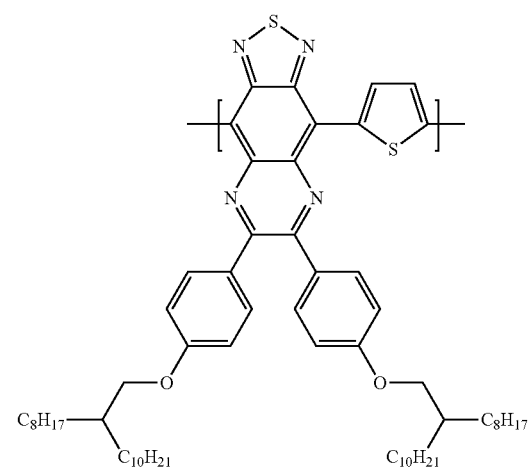

As shown in Reaction Scheme 2-1a, 510 mg (Yield: 83%) of a comparison polymer including a structural unit represented by Chemical Formula 2-1 (Comparative Polymer 1, a number average molecular weight (Mn)=11,833 g/mol, PDI=1.82) is synthesized according to the same method as the step (3) of Synthesis Example 1-1 except that Monomer A (660 mg, 0.605 mmol), 2,5-bis(trimethylstannyl)thiophene (248.0 mg, 0.605 mmol) (Sigma Aldrich Co. Ltd.), $Pd_2(dba)_3$ (5.5 mg, 6.1 μmol), tri(o-tolyl)phosphine (14.8 mg, 48.7 μmol), and anhydrous chlorobenzene (12.0 mL) are used.

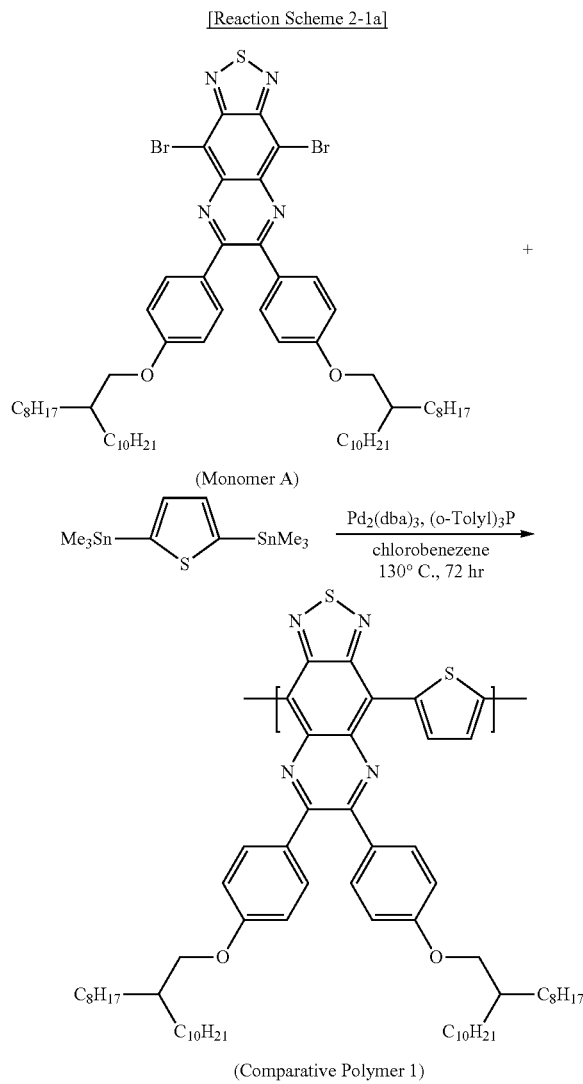

[Reaction Scheme 2-1a]

(Monomer A)

(Comparative Polymer 1)

Evaluation I: Maximum Absorption Wavelength

The polymers according to Synthesis Examples 1 to 9 are respectively dissolved in $CHCl_3$ at a concentration of $1 \times 10^{-5}$ M to prepare solutions and thus evaluate light absorption characteristics of the compounds in a solution state. The results are shown in Table 1. The light absorption characteristics are evaluated by measuring a maximum absorption wavelength ($\lambda_{max}$) using a UV-3600 Plus UV-Vis-NIR spectrometer (Shimadzu Corp.).

In addition, 20 mg of each polymer according to Synthesis Examples 1 to 9 is dissolved in 1.0 mL of anhydrous chlorobenzene, and the solutions are respectively spin-coated on a glass substrate to form thin films to evaluate light absorption characteristics of the polymers in a thin film state. The light absorption characteristics are evaluated by measuring a maximum absorption wavelength ($\lambda_{max}$) using an UV-3600 Plus UV-Vis-NIR spectrometer (Shimadzu Corp.).

The results are shown in Table 1.

TABLE 1

|  | Maximum absorption wavelength ($\lambda_{max}$, nm) | |
|---|---|---|
|  | Solution ($CHCl_3$) | film |
| Synthesis Example 1 (Polymer 1) | 1410 | 1420 |
| Synthesis Example 2 (Polymer 2) | 1125 | 1120 |
| Synthesis Example 3 (Polymer 3) | 1110 | 1164 |
| Synthesis Example 4 (Polymer 4) | 1460 | 1509 |
| Synthesis Example 5 (Polymer 5) | 1014 | 1127 |
| Synthesis Example 6 (Polymer 6) | 1410 | 1440 |
| Synthesis Example 7 (Polymer 7) | 1100 | 1255 |
| Synthesis Example 8 (Polymer 8) | 1070 | 1070 |
| Synthesis Example 9 (Polymer 9) | 1060 | 1170 |

Referring to Table 1, all the polymers according to Synthesis Examples 1 to 9 exhibit satisfactory wavelength absorption in an infrared wavelength region.

Evaluation II: Extinction Coefficient 20 mg of each polymer according to Synthesis Examples 1 to 9 and Comparative Synthesis Example 1 is dissolved in 1.0 mL of anhydrous chlorobenzene, and the solutions are respectively coated on a glass substrate to measure an extinction coefficient in a thin film state. The extinction coefficient is measured by using an UV-3600 Plus UV-Vis-NIR spectrometer (Shimadzu Corp.). A thickness of each thin film is measured to calculate an extinction coefficient for a unit thickness at the maximum absorption wavelength of the measured absorption spectrum.

The results are shown in Table 2.

TABLE 2

| polymer | Extinction coefficient ($cm^{-1}$) (@ maximum absorption wavelength) |
|---|---|
| Synthesis Example 1 (Polymer 1) | $4.51 \times 10^4$ |
| Synthesis Example 2 (Polymer 2) | $3.41 \times 10^4$ |
| Synthesis Example 3 (Polymer 3) | $3.28 \times 10^4$ |
| Synthesis Example 4 (Polymer 4) | $2.97 \times 10^4$ |
| Synthesis Example 5 (Polymer 5) | $3.25 \times 10^4$ |
| Synthesis Example 6 (Polymer 6) | $3.13 \times 10^4$ |
| Synthesis Example 7 (Polymer 7) | $4.51 \times 10^4$ |
| Synthesis Example 8 (Polymer 8) | $3.34 \times 10^4$ |
| Synthesis Example 9 (Polymer 9) | $3.44 \times 10^4$ |
| Comparative Synthesis Example 1 (Comparative Polymer 1) | $2.54 \times 10^4$ |

Referring to Table 2, the polymers according to Synthesis Examples 1 to 9 exhibits a high extinction coefficient at a maximum absorption wavelength, compared with the polymer according to Comparative Synthesis Example 1.

Evaluation III: Energy Level and Energy Bandgap 20 mg of each polymer of Synthesis Examples 1 to 9 is dissolved in 1.0 mL of anhydrous chlorobenzene, and the solutions are respectively spin-coated on a silicon wafer to form thin films. HOMO energy levels thereof are measured by using a photoelectron spectrometer (CV-3). Optical energy bandgaps ($E_g$) are calculated from an absorption onset wavelength of an absorption spectrum of each thin film formed on the glass substrate (bandgap=1240/onset wavelength) and used to calculate LUMO energy levels of the thin films. The results are shown in Table 3.

TABLE 3

| polymer | Energy level (eV) (film) (CV-3 equipment) | | |
|---|---|---|---|
| | HOMO | LUMO | Energy bandgap ($E_g$) |
| Synthesis Example 1 (Polymer 1) | 5.06 | 4.40 | 0.66 |
| Synthesis Example 2 (Polymer 2) | 5.06 | 4.19 | 0.87 |
| Synthesis Example 3 (Polymer 3) | 4.95 | 4.17 | 0.78 |
| Synthesis Example 4 (Polymer 4) | 4.46 | 3.91 | 0.55 |
| Synthesis Example 5 (Polymer 5) | 5.07 | 4.21 | 0.86 |
| Synthesis Example 6 (Polymer 6) | 5.13 | 4.52 | 0.60 |
| Synthesis Example 7 (Polymer 7) | 4.89 | 4.15 | 0.74 |
| Synthesis Example 8 (Polymer 8) | 5.01 | 4.10 | 0.91 |
| Synthesis Example 9 (Polymer 9) | 4.85 | 4.04 | 0.81 |

Referring to Table 3, the polymers of Synthesis Examples 1 to 9 effectively absorb light in an infrared wavelength region due to low energy bandgap characteristics.

Examples and Comparative Examples: Production of Photoelectric Device

A 150 nm-thick anode is formed by sputtering ITO on a glass substrate. Subsequently, on the anode, PEDOT (poly (3,4-ethylenedioxythiophene)) is spin-coated to be 45 nm thick to form a hole transport layer (HTL). Then, each polymer of Synthesis Examples 1 to 9 and Comparative Synthesis Example 1 and PC$_{70}$BM represented by Chemical Formula 7 are dissolved in a mass ratio of 1:1.5 (polymer: PC$_{70}$BM), and the solutions are respectively spin-coated to from a 150 nm-thick photoactive layer (photoelectric conversion layer). On the photoelectric conversion layer, C60 is deposited to form a 30 nm-thick auxiliary layer. On the auxiliary layer, ITO is sputtered to form a 7 nm-thick cathode. On the cathode, aluminum oxide (Al$_2$O$_3$) is deposited to form a 50 nm-thick anti-reflection layer, and each photoelectric device of Examples 1 to 9 and Comparative Example 1 is manufactured by sealing with a glass plate and sequentially, annealing at each temperature of 120° C. and 140° C. for 30 minutes.

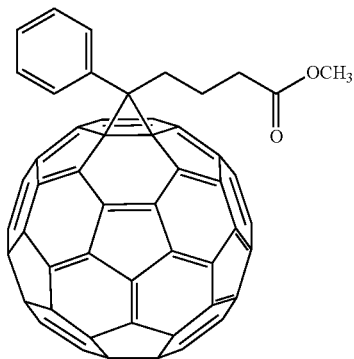

[Chemical Formula 7]

Evaluation III: Photoelectric Conversion Efficiency

Photoelectric conversion efficiency (EQE) of the photoelectric devices according to Examples 1 to 9 and Comparative Example 1 is evaluated. The photoelectric conversion efficiency is measured by using an IPCE measurement system (TNE Technology Co., Ltd., Korea). First, the system is calibrated by using a Si photodiode (Hamamatsu Photonics K.K., Japan) and then, mounted on a photoelectric device to measure the photoelectric conversion efficiency in a wavelength range of about 400 nm to about 1600 nm.

Figure 10:
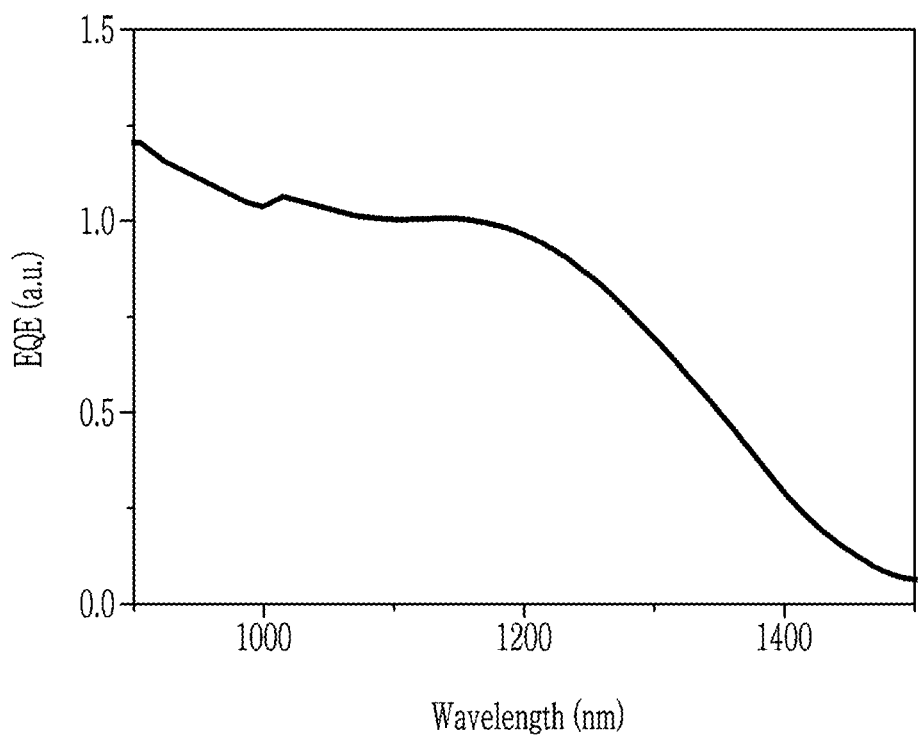
FIG. 10 is a graph showing photoelectric conversion efficiency (EQE) measurement results of the photoelectric device according to Example 3.

The photoelectric conversion efficiency (EQE) of the photoelectric device according to Example 3 is shown in FIG. 10. FIG. 10 is a graph showing photoelectric conversion efficiency of the photoelectric devices of Example 1 and Comparative Example 2. Referring to FIG. 10, the photoelectric device of Example 3 exhibits photoelectric conversion efficiency due to PC$_{70}$BM in a region of less than or equal to 1000 nm and photoelectric conversion efficiency at about 1200 nm due to Polymer 3.

While this disclosure has been described in connection with what is presently considered to be practical example embodiments, it is to be understood that inventive concepts are not limited to the disclosed embodiments. On the contrary, inventive concepts are intended to cover various modifications and equivalent arrangements included within the spirit and scope of the appended claims.

What is claimed is:

1. An infrared absorbing polymer, comprising:
a first structural unit represented by Chemical Formula 1 and a second structural unit including at least one of Chemical Formula 2A to Chemical Formula 2I:

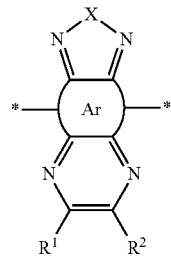

[Chemical Formula 1]

wherein, in Chemical Formula 1,
Ar is a substituted or unsubstituted C6 to C30 aromatic ring, a substituted or unsubstituted C3 to C30 heteroaromatic ring, or a combination thereof, X is O, S, Se, Te, S(=O), S(=O$_2$), NR$^a$, CR$^b$R$^c$, SiR$^d$R$^e$, GeR$^f$R$^g$, CR$^h$=CR$^i$, or CR$^{hh}$=CR$^{ii}$, wherein R$^a$, R$^b$, R$^c$, R$^d$, R$^e$, R$^f$, R$^g$, R$^h$, and R$^i$ are independently hydrogen, deuterium, a C1 to C6 alkyl group, a C1 to C6 haloalkyl group, a C6 to C14 aryl group, a C3 to C12 heteroaryl group, a halogen, a cyano group, or a combination thereof, and R$^{hh}$ and R$^{ii}$ are linked to each other to form an aromatic ring, and R$^1$ and R$^2$ are a substituted or unsubstituted C6 to C30 aryl group or a substituted or unsubstituted C3 to C30 heteroaryl group, or R$^1$ and R$^2$ are linked to each other to form a substituted or unsubstituted C6 to C30 arene group and a substituted or unsubstituted C3 to C30 heteroarene group,

[Chemical Formulas 2A to 2I]

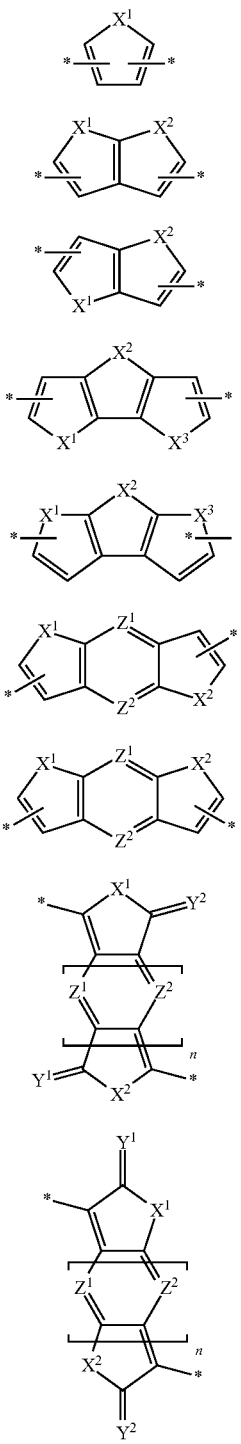

(2A)
(2B)
(2C)
(2D)
(2E)
(2F)
(2G)
(2H)
(2I)

wherein, in Chemical Formula 2A, $X^1$ is Se, Te, S(=O), S(=O)$_2$, NR$^a$, SiR$^d$R$^e$, or GeR$^f$R$^g$, wherein R$^a$, R$^b$, R$^c$, R$^d$, R$^e$, R$^f$, R$^g$, R$^h$, and R$^i$ are independently hydrogen, deuterium, a C1 to C20 alkyl group, a C1 to C20 haloalkyl group, a C6 to C20 aryl group, a C3 to C20 heteroaryl group, a halogen, a cyano group, or a combination thereof, in Chemical Formulas 2B to 2I, $X^1$ to $X^3$ are independently S, Se, Te, S(=O), S(=O)$_2$, NR$^a$, SiR$^d$R$^e$, or GeR$^f$R$^g$, wherein R$^a$, R$^b$, R$^c$, R$^d$, R$^e$, R$^f$, R$^g$, R$^h$, and R$^i$ are independently hydrogen, deuterium, a C1 to C20 alkyl group, a C1 to C20 haloalkyl group, a C6 to C20 aryl group, a C3 to C20 heteroaryl group, a halogen, a cyano group, or a combination thereof, provided that at least one of $X^1$ and $X^2$ is not S in Chemical Formulas 2B, 2C, 2F, and 2G, and $X^2$ is not SiR$^d$R$^e$ or GeR$^f$R$^g$ in Chemical Formula 2D, $Z^1$ and $Z^2$ are independently N or CR$^x$, wherein R$^x$ is hydrogen, deuterium, a C1 to C10 alkyl group, a C1 to C10 haloalkyl group, a —SiH$_3$ group, a C1 to C10 alkylsilyl group, a —NH$_2$ group, a C1 to C10 alkylamine group, a C6 to C12 aryl group, a C3 to C12 heteroaryl group, a halogen, a cyano group, or a combination thereof, $Y^1$ and $Y^2$ are independently O, S, Se, or Te, in Chemical Formula 2H, n is 1, in Chemical Formula 2I, n is 0 or 1, and at least one hydrogen of each aromatic ring is optionally replaced by deuterium, a halogen, a cyano group, a C1 to C30 alkyl group, a C1 to C30 alkoxy group, a C1 to C30 haloalkyl group, a C6 to C30 aryl group, a C6 to C30 aryloxy group, a —SiH$_3$ group, or a C1 to C30 alkylsilyl group, wherein the infrared absorbing polymer comprises about 20 mol % to about 50 mol % of the first structural unit and about 50 mol % to 80 mol % of the second structural unit.

2. The infrared absorbing polymer of claim 1, wherein in Chemical Formula 1, Ar is benzene, a substituted or unsubstituted naphthalene, a substituted or unsubstituted anthracene, a substituted or unsubstituted phenanthrene, a substituted or unsubstituted tetracene, a substituted or unsubstituted pyrene, a substituted or unsubstituted quinoline, a substituted or unsubstituted isoquinoline, a substituted or unsubstituted quinoxaline, a substituted or unsubstituted quinazoline, or a substituted or unsubstituted phenanthroline.

3. The infrared absorbing polymer of claim 1, wherein in Chemical Formula 1, Ar is one of the moieties represented by Chemical Formula A-1:

[Chemical Formula A-1]

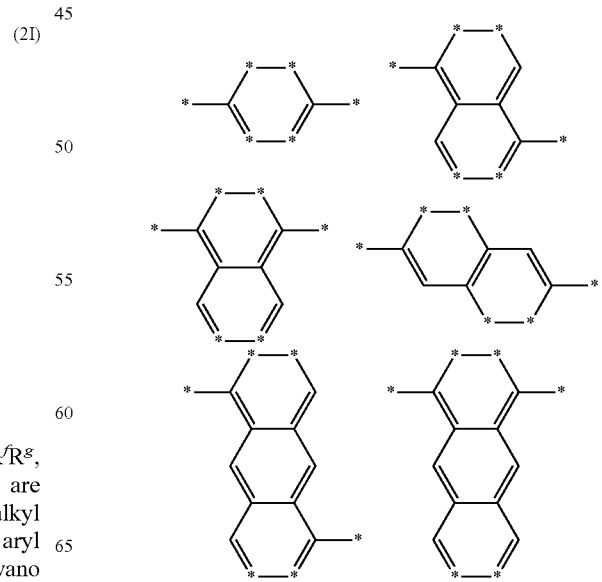

-continued

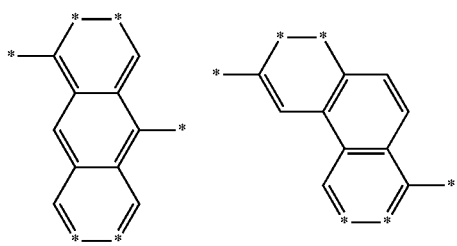

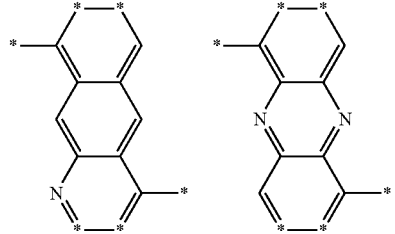

wherein, in Chemical Formula A-1,
at least one hydrogen of each aromatic ring is optionally replaced by deuterium, a halogen, a cyano group, a C1 to C10 alkyl group, a C1 to C10 haloalkyl group, a —SiH₃ group, or a C1 to C10 alkylsilyl group, and
* inside the aromatic ring is a portion that is bound to the N—X—N-containing ring and the pyrazine ring of Chemical Formula 1.

4. The infrared absorbing polymer of claim 1, wherein in Chemical Formula 1, Ar is one of the moieties represented by Chemical Formula A-2:

[Chemical Formula A-2]

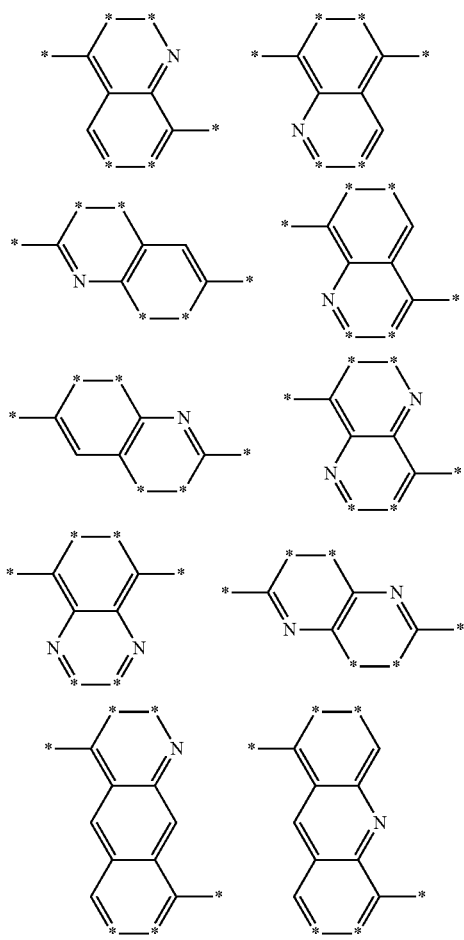

wherein, in Chemical Formula A-2,
at least one hydrogen of each aromatic ring is optionally replaced by deuterium, a halogen, a cyano group, a C1 to C10 alkyl group, a C1 to C10 haloalkyl group, a —SiH₃ group, or a C1 to C10 alkylsilyl group, and
* inside the aromatic ring is a portion that is bound to the N—X—N-containing ring and the pyrazine ring of Chemical Formula 1.

5. The infrared absorbing polymer of claim 1, wherein in Chemical Formula 1, the substituted or unsubstituted C6 to C30 arene group and a substituted or unsubstituted C3 to C30 heteroarene group formed by linking R¹ and R² to each other is a substituted or unsubstituted benzene, a substituted or unsubstituted naphthalene, a substituted or unsubstituted acenaphthene, a substituted or unsubstituted anthracene, a substituted or unsubstituted phenanthrene, a substituted or unsubstituted tetracene or a substituted or unsubstituted pyrene; or a substituted or unsubstituted quinoline, a substituted or unsubstituted isoquinoline, a substituted or unsubstituted quinoxaline, a substituted or unsubstituted quinazoline, a substituted or unsubstituted phenanthroline, a substituted or unsubstituted pyrimidine, or a substituted or unsubstituted benzodithiophene.

6. The infrared absorbing polymer of claim 1, wherein in Chemical Formula 1, the substituted or unsubstituted C6 to C30 arene group and a substituted or unsubstituted C3 to C30 heteroarene group formed by linking R¹ and R² to each other is one of the moieties represented by Chemical Formula B-1 and Chemical Formula B-2:

[Chemical Formula B-1]

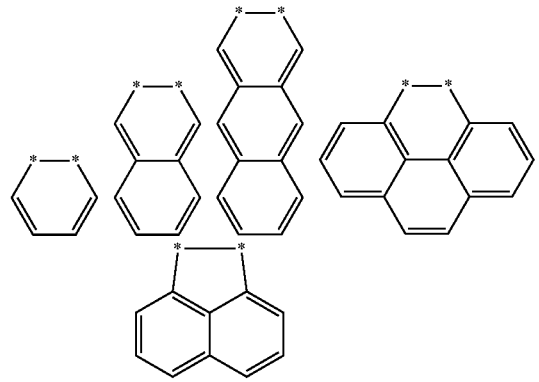

wherein, in Chemical Formula B-1,
at least one hydrogen of each aromatic ring is optionally replaced by a halogen, a cyano group, a C1 to C30 alkyl group, a C1 to C30 alkoxy group, a C1 to C30 haloalkyl group, a —SiH₃ group, a C1 to C30 alkylsilyl group, a C6 to C30 aryl group, or a C3 to C30 heteroaryl group, and

* inside the aromatic ring is a portion that is bound to the pyrazine ring of Chemical Formula 1,

[Chemical Formula B-2]

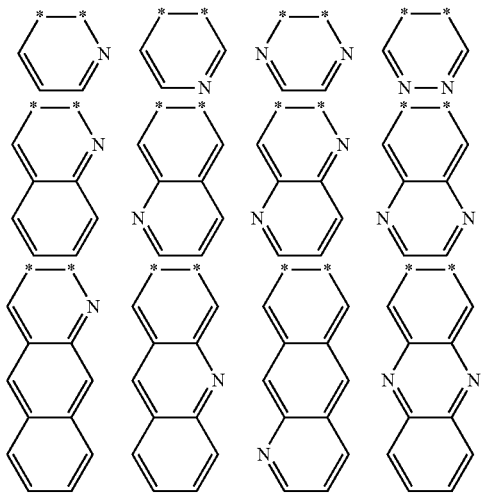

wherein, in Chemical Formula B-2,
at least one hydrogen of each aromatic ring is optionally replaced by a halogen, a cyano group, a C1 to C30 alkyl group, a C1 to C30 alkoxy group, a C1 to C30 haloalkyl group, a —SiH$_3$ group, a C1 to C30 alkylsilyl group, a C6 to C30 aryl group, a C6 to C30 aryloxy group, or a C3 to C30 heteroaryl group, and
* inside the aromatic ring is a portion that is bound to the pyrazine ring of Chemical Formula 1.

7. The infrared absorbing polymer of claim 1, wherein in Chemical Formula 1, the substituted or unsubstituted C6 to C30 arene group and a substituted or unsubstituted C3 to C30 heteroarene group formed by linking R$^1$ and R$^2$ to each other is one of moieties represented by Chemical Formula B-3-1 or Chemical Formula B-3-2:

[Chemical Formula B-3-1]

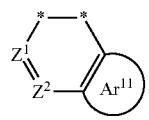

[Chemical Formula B-3-2]

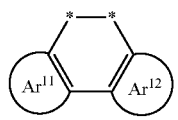

wherein, in Chemical Formulas B-3-1 and B-3-2,
Ar$^{11}$ and Ar$^{12}$ are independently a substituted or unsubstituted C6 to C30 arene group or a substituted or unsubstituted C3 to C30 heteroarene group,
in Chemical Formula B-3-1, Z$^1$ and Z$^2$ are independently N or CR$^x$, wherein R$^x$ is hydrogen, deuterium, a C1 to C10 alkyl group, a C1 to C10 haloalkyl group, a —SiH$_3$ group, a C1 to C10 alkylsilyl group, a —NH$_2$ group, a C1 to C10 alkylamine group, a C6 to C10 arylamine group, a C6 to C14 aryl group, a C3 to C12 heteroaryl group, a halogen, a cyano group, or a combination thereof, and

* inside the aromatic ring is a portion that is bound to the pyrazine ring of Chemical Formula 1.

8. The infrared absorbing polymer of claim 7, wherein the moiety represented by Chemical Formula B-3-1 is represented by Chemical Formula B-3-11, and the moiety represented by Chemical Formula B-3-2 is represented by Chemical Formula B-3-21:

[Chemical Formula B-3-11]

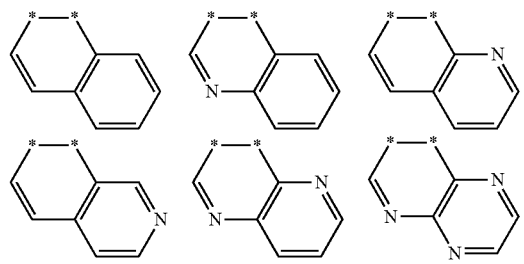

[Chemical Formula B-3-21]

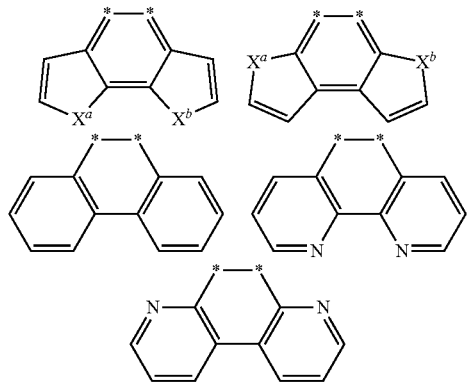

wherein, in Chemical Formula B-3-11 and Chemical Formula B-3-21,
at least one hydrogen of each aromatic ring is optionally replaced by a halogen, a cyano group, a C1 to C30 alkyl group, a C1 to C30 alkoxy group, a C1 to C30 haloalkyl group, a —SiH$_3$ group, a C1 to C30 alkylsilyl group, a C6 to C30 aryl group, a C6 to C30 aryloxy group, or a C3 to C30 heteroaryl group,
X$^a$ and X$^b$ are independently —O—, —S—, —Se—, —Te—, —NR$^a$—, —SiR$^b$R$^c$—, or —GeR$^d$R$^e$—, wherein R$^a$, R$^b$, R$^c$, R$^d$, and R$^e$ are independently hydrogen, a halogen, a substituted or unsubstituted C1 to C10 alkyl group, or a substituted or unsubstituted C6 to C10 aryl group, and
* inside the aromatic ring is a portion that is bound to the pyrazine ring of Chemical Formula 1.

9. The infrared absorbing polymer of claim 1, wherein the infrared absorbing polymer further comprises a third structural unit represented by Chemical Formula 3:

[Chemical Formula 3]

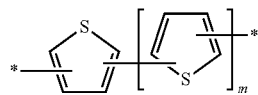

wherein, in Chemical Formula 3,
m is an integer of 0 to 3, and
at least one hydrogen of each aromatic ring is optionally replaced by deuterium, a halogen, a cyano group, a C1 to C10 alkyl group, a C1 to C10 haloalkyl group, a —SiH$_3$ group, or a C1 to C10 alkylsilyl group.

10. The infrared absorbing polymer of claim 9, wherein the third structural unit is included in an amount of about 40 parts by mole to about 300 parts by mole based on 100 parts by mole of a sum of the first structural unit and the second structural unit.

11. The infrared absorbing polymer of claim 1, wherein the infrared absorbing polymer exhibits a peak absorption wavelength in a wavelength range of about 750 nm to about 3000 nm.

12. An infrared absorbing/blocking film comprising:
the infrared absorbing polymer of claim 1.

13. A photoelectric device, comprising:
a first electrode and a second electrode facing each other, and
a photoactive layer between the first electrode and the second electrode,
wherein the photoactive layer includes an infrared absorbing polymer including a first structural unit represented by Chemical Formula 1 and a second structural unit including at least one of Chemical Formula 2A to Chemical Formula 2I,

[Chemical Formula 1]

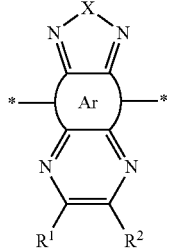

wherein, in Chemical Formula 1,
Ar is a substituted or unsubstituted C6 to C30 aromatic ring, a substituted or unsubstituted C3 to C30 heteroaromatic ring, or a combination thereof,
X is O, S, Se, Te, S(=O), S(=O)$_2$, NR$^a$, CR$^b$R$^c$, SiR$^d$R$^e$, GeR$^f$R$^g$, CR$^h$=CR$^i$, or CR$^{hh}$=CR$^{ii}$, wherein R$^a$, R$^b$, R$^c$, R$^d$, R$^e$, R$^f$, R$^g$, R$^h$, and R$^i$ are independently hydrogen, deuterium, a C1 to C6 alkyl group, a C1 to C6 haloalkyl group, a C6 to C14 aryl group, a C3 to C12 heteroaryl group, a halogen, a cyano group, or a combination thereof, and R$^{hh}$ and R$^{ii}$ are linked to each other to form an aromatic ring, and
R$^1$ and R$^2$ are a substituted or unsubstituted C6 to C30 aryl group or a substituted or unsubstituted C3 to C30 heteroaryl group, or R$^1$ and R$^2$ are linked to each other to form a substituted or unsubstituted C6 to C30 arene group and a substituted or unsubstituted C3 to C30 heteroarene group, Chemical Formulas 2A to 2I (2A)

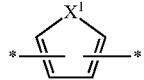

-continued (2B)

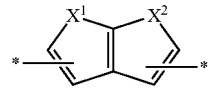

(2C)

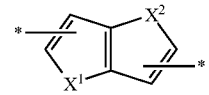

(2D)

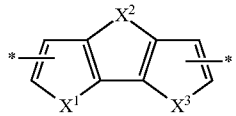

(2E)

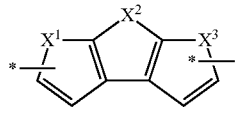

(2F)

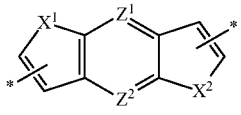

(2G)

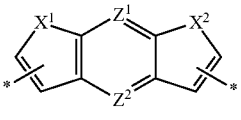

(2H)

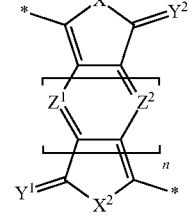

(2I)

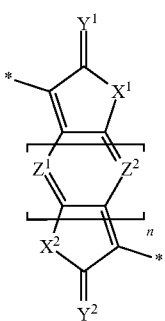

wherein, in Chemical Formula 2A,
X$^1$ is Se, Te, S(=O), S(=O)$_2$, NR$^a$, SiR$^d$R$^e$, or GeR$^f$R$^g$, wherein R$^a$, R$^b$, R$^c$, R$^d$, R$^e$, R$^f$, R$^g$, R$^h$, and R$^i$ are independently hydrogen, deuterium, a C1 to C20 alkyl group, a C1 to C20 haloalkyl group, a C6 to C20 aryl group, a C3 to C20 heteroaryl group, a halogen, a cyano group, or a combination thereof,
in Chemical Formulas 2B to 2I,
X$^1$ to X$^3$ are independently S, Se, Te, S(=O), S(=O)$_2$, NR$^a$, SiR$^d$R$^e$, or GeR$^f$R$^g$, wherein R$^a$, R$^b$, R$^c$, R$^d$, R$^e$, R$^f$, R$^g$, R$^h$, and R$^i$ are independently hydrogen, deuterium, a C1 to C20 alkyl group, a C1 to C20 haloalkyl group, a C6 to C20 aryl group, a C3 to C20 heteroaryl group, a halogen, a cyano group, or a combination thereof, provided that at least one of $X^1$ and $X^2$ is not S in Chemical Formulas 2B, 2C, 2F, and 2G, and $X^2$ is not $SiR^dR^e$ or $GeR^fR^g$ in Chemical Formula 2D, $Z^1$ and $Z^2$ are independently N or $CR^x$, wherein $R^x$ is hydrogen, deuterium, a C1 to C10 alkyl group, a C1 to C10 haloalkyl group, a —SiH$_3$ group, a C1 to C10 alkylsilyl group, a —NH$_2$ group, a C1 to C10 alkylamine group, a C6 to C12 aryl group, a C3 to C12 heteroaryl group, a halogen, a cyano group, or a combination thereof, $Y^1$ and $Y^2$ are independently O, S, Se, or Te, in Chemical Formula 2H, n is 1, in Chemical Formula 2I, n is 0 or 1, and at least one hydrogen of each aromatic ring is optionally replaced by deuterium, a halogen, a cyano group, a C1 to C30 alkyl group, a C1 to C30 alkoxy group, a C1 to C30 haloalkyl group, a C6 to C30 aryl group, a C6 to C30 aryloxy group, a —SiH$_3$ group, or a C1 to C30 alkylsilyl group, wherein the infrared absorbing polymer comprises about 20 mol % to about 50 mol % of the first structural unit and about 50 mol % to 80 mol % of the second structural unit.

14. The photoelectric device of claim 13, wherein the photoactive layer further comprises fullerene or a fullerene derivative.

15. The photoelectric device of claim 13, wherein a peak absorption wavelength of the photoactive layer belong to a wavelength region of about 750 nm to about 3000 nm.

16. The photoelectric device of claim 13, wherein
the photoactive layer comprises the infrared absorbing polymer; and
an n-type semiconductor connected to the infrared absorbing polymer.

17. The photoelectric device of claim 13, wherein
the infrared absorbing polymer comprises about 20 mol % to about 50 mol % of the first structural unit and about 50 mol % to 80 mol % of the second structural unit, and
the infrared absorbing polymer exhibits a peak absorption wavelength in a wavelength range of about 750 nm to about 3000 nm.

18. A sensor comprising:
the photoelectric device of claim 14.

19. An electronic device comprising:
the photoelectric device of claim 14.

* * * * *